(12) United States Patent
Park et al.

(10) Patent No.: US 10,991,903 B2
(45) Date of Patent: *Apr. 27, 2021

(54) DISPLAY PANEL CAPABLE OF PREVENTING A DEFECT IN LIGHT EMISSION OF AN ORGANIC LIGHT EMITTING ELEMENT

(71) Applicant: Samsung Display Co., Ltd., Yongin-si (KR)

(72) Inventors: Ilseok Park, Yongin-si (KR); Sangyeol Kim, Yongin-si (KR); Jungyeon Kim, Yongin-si (KR); Byeongmin Jang, Yongin-si (KR); Woosik Jeon, Yongin-si (KR); Junkyung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/820,072

(22) Filed: Mar. 16, 2020

(65) Prior Publication Data

US 2020/0220099 A1 Jul. 9, 2020

Related U.S. Application Data

(60) Continuation of application No. 16/593,060, filed on Oct. 4, 2019, now Pat. No. 10,600,986, which is a
(Continued)

(30) Foreign Application Priority Data

Jul. 18, 2016 (KR) .......................... 10-2016-0090947

(51) Int. Cl.
*H01L 27/32* (2006.01)
*H01L 51/52* (2006.01)
(Continued)

(52) U.S. Cl.
CPC ...... *H01L 51/5228* (2013.01); *H01L 27/3209* (2013.01); *H01L 27/3246* (2013.01);
(Continued)

(58) Field of Classification Search
CPC ... H01L 27/32; H01L 27/3209; H01L 33/387; H01L 51/504; H01L 51/5088; H01L 51/5203

See application file for complete search history.

(56) References Cited

U.S. PATENT DOCUMENTS 8,044,574 B2 10/2011 Yamazaki et al.
8,094,096 B2 1/2012 Okumoto
(Continued)

FOREIGN PATENT DOCUMENTS

| CN | 101911832 | 12/2010 |
| CN | 107230692 | 10/2017 |
| KR | 10-2015-0113308 | 10/2015 |

OTHER PUBLICATIONS

Notice of Allowance dated May 28, 2019, in U.S. Appl. No. 16/020,572.
(Continued)

*Primary Examiner* — Hoai V Pham
(74) *Attorney, Agent, or Firm* — H.C. Park & Associates, PLC

(57) ABSTRACT

A display panel includes an auxiliary electrode on a base substrate, a first electrode spaced from the auxiliary electrode, a first light emitting unit on the auxiliary electrode and the first electrode, an conductive thin film layer on the first light emitting unit, a second light emitting unit on the conductive thin film layer, a first contact hole through the conductive thin film layer to expose the auxiliary electrode, a insulating layer in the first contact hole, and a second electrode including a first electrode part and a second electrode part, the first electrode part being on the insulating layer in the first contact hole, and the second electrode part overlapping the first electrode and being on the second light
(Continued)

emitting unit, in which the insulating layer is between the first electrode part and the conductive thin film layer.

21 Claims, 17 Drawing Sheets

Related U.S. Application Data continuation of application No. 16/020,572, filed on Jun. 27, 2018, now Pat. No. 10,439,161, which is a division of application No. 15/646,362, filed on Jul. 11, 2017, now Pat. No. 10,020,461.

(51) Int. Cl.
  *H01L 51/00*    (2006.01)
  *H01L 51/50*    (2006.01)
  *H01L 51/56*    (2006.01)

(52) U.S. Cl.
  CPC ...... *H01L 51/0096* (2013.01); *H01L 51/5044* (2013.01); *H01L 51/5206* (2013.01); *H01L 51/56* (2013.01); *H01L 2251/301* (2013.01); *H01L 2251/5392* (2013.01); *H01L 2251/558* (2013.01)

(56) References Cited

U.S. PATENT DOCUMENTS

| | | | |
|---|---|---|---|
| 10,020,461 B2* | 7/2018 | Park | H01L 51/5044 |
| 10,096,662 B2 | 10/2018 | Choi et al. | |
| 10,600,986 B1* | 3/2020 | Park | H01L 27/3209 |
| 2005/0253508 A1* | 11/2005 | Okano | H01L 51/5228 |
| | | | 313/506 |
| 2009/0195154 A1 | 8/2009 | Yamazaki et al. | |
| 2011/0133226 A1 | 6/2011 | Lee et al. | |
| 2014/0239262 A1 | 8/2014 | Kim et al. | |
| 2015/0014658 A1 | 1/2015 | Choung et al. | |
| 2015/0188077 A1 | 7/2015 | Kim et al. | |
| 2015/0214498 A1 | 7/2015 | Ichikawa et al. | |
| 2016/0093680 A1 | 3/2016 | Paek et al. | |
| 2016/0190521 A1 | 6/2016 | Lee et al. | |
| 2017/0317154 A1 | 11/2017 | Heo | |

OTHER PUBLICATIONS

Notice of Allowance dated Mar. 8, 2018, in U.S. Appl. No. 15/646,362.
Notice of Allowance dated Nov. 15, 2019, in U.S. Appl. No. 16/593,060.

* cited by examiner

DISPLAY PANEL CAPABLE OF PREVENTING A DEFECT IN LIGHT EMISSION OF AN ORGANIC LIGHT EMITTING ELEMENT

CROSS-REFERENCE TO RELATED APPLICATIONS

This application is a Continuation of U.S. patent application Ser. No. 16/593,060, filed on Oct. 4, 2019, which is a Continuation of U.S. patent application Ser. No. 16/020,572, filed on Jun. 27, 2018, now issued as U.S. Pat. No. 10,439,161, which is a Divisional application of U.S. patent application Ser. No. 15/646,362, filed on Jul. 11, 2017, now issued as U.S. Pat. No. 10,020,461, which claims priority to and the benefit of Korean Patent Application No. 10-2016-0090947, filed on Jul. 18, 2016, each of which is hereby incorporated by reference for all purposes as if fully set forth herein.

BACKGROUND

Field

The present disclosure relates to a display panel and a method of manufacturing the same. More particularly, the present disclosure relates to a display panel capable of preventing a defect in light emission of an organic light emitting element from occurring due to a lateral leakage current, a method of manufacturing the display panel, and a display device having the display panel.

Discussion of the Background

An organic light emitting device is a self-emissive device and has advantages of a wide viewing angle and a superior contrast ratio. In addition, the organic light emitting device has a fast response speed, a high brightness, and a low driving voltage. In general, the organic light emitting device includes an anode, a hole transport layer, a light emitting layer, an electron transport layer, and a cathode. The hole transport layer, the light emitting layer, the electron transport layer, and the cathode are sequentially stacked on the anode. The hole transport layer, the light emitting layer, and the electron transport layer are organic thin layers, each including an organic compound.

When different voltages are respectively applied to the anode and the cathode of the organic light emitting device, holes injected from the anode move to the light emitting layer through the hole transport layer, and electrons injected from the cathode move to the light emitting layer through the electron transport layer. The holes are recombined with the electrons in the light emitting layer to generate excitons, and the organic light emitting device emits light by the excitons that return to a ground state from an excited state.

SUMMARY

Embodiments provide a display panel including a base substrate, an auxiliary electrode disposed on the base substrate, a first electrode spaced apart from the auxiliary electrode when viewed in a plan view, a first light emitting unit disposed on the auxiliary electrode and the first electrode, an conductive thin film layer disposed on the first light emitting unit, a second light emitting unit disposed on the conductive thin film layer, a insulating layer including a first part disposed in a first contact hole defined through at least the first light emitting unit, the conductive thin film layer, and the second light emitting unit to expose the auxiliary electrode, and a second electrode including a first electrode part and a second electrode part, the first electrode part being disposed on the first part and including at least a portion disposed in the first contact hole and the second electrode part extending from the first electrode part, overlapped with the first electrode when viewed in a plan view, and disposed on the second light emitting unit. A portion of the first part is disposed between the first electrode part and the conductive thin film layer to insulate the first electrode part from the conductive thin film layer.

The other portion of the first part is disposed between the first electrode part and the auxiliary electrode.

The other portion of the first part makes contact with the auxiliary electrode.

The portion of the first part makes contact with an exposing surface of the conductive thin film layer exposed through the first contact hole.

A second contact hole is defined in the other portion of the first part to expose at least a portion of an upper surface of the auxiliary electrode, and a portion of the first electrode part is disposed in the second contact hole defined in the insulating layer to make contact with the auxiliary electrode.

The insulating layer further includes a second part extending from the first part and disposed between the second light emitting unit and the second electrode.

The display panel further includes a pixel definition layer disposed between the auxiliary electrode and the first electrode when viewed in a plan view, and the insulating layer further includes a third part disposed on the pixel definition layer to connect the first and second parts.

The second part is overlapped with the first electrode when viewed in a plan view.

The insulating layer is spaced apart from the first electrode when viewed in a plan view.

The first light emitting unit generates a first light, and the second light emitting unit generates a light having a color different from a color of the first light.

The insulating layer has a resistance greater than a resistance of the conductive thin film layer.

The insulating layer has a thickness from about 1 nm to about 10 nm.

The insulating layer includes at least one of LiF and LiQ.

Embodiments also provide a method of manufacturing a display panel, including forming an auxiliary electrode in a first area defined in a base substrate, forming a first electrode in a second area defined in the base substrate and spaced apart from the first area when viewed in a plan view, forming a first light emitting unit on the first electrode, forming an conductive thin film layer on the first light emitting unit, forming a second light emitting unit on the conductive thin film layer, removing at least a portion of the first light emitting unit, the conductive thin film layer, and the second light emitting unit to form a first contact hole through which an upper surface of the auxiliary electrode is exposed, forming a insulating layer on an exposing surface of the conductive thin film layer, which is exposed through the first contact hole, and forming a second electrode on the insulating layer.

The method further includes removing a portion of the insulating layer to form a second contact hole, through which at least a portion of the upper surface of the auxiliary electrode is exposed, through the insulating layer.

The forming the second contact hole is performed after the forming the insulating layer and before the forming the second electrode.

The first light emitting unit, the conductive thin film layer, and the second light emitting unit are removed using a laser drilling method.

Embodiments also provide a display device including a display panel and a controller controlling the display panel. The display panel includes a base substrate, an auxiliary electrode disposed on the base substrate, a first electrode spaced apart from the auxiliary electrode when viewed in a plan view, a first light emitting unit disposed on the auxiliary electrode and the first electrode, an conductive thin film layer disposed on the first light emitting unit, a second light emitting unit disposed on the conductive thin film layer, a insulating layer including a first part disposed in a first contact hole defined through at least the first light emitting unit, the conductive thin film layer, and the second light emitting unit to expose the auxiliary electrode, and a second electrode including a first electrode part disposed in the first contact hole and disposed on the first par and a second electrode part extending from the first electrode part, overlapped with the first electrode when viewed in a plan view, and disposed on the second light emitting unit. A portion of the first part is disposed between the first electrode part and the conductive thin film layer to insulate the first electrode part from the conductive thin film layer.

The other portion of the first part is disposed between the first electrode part and the auxiliary electrode.

The other portion of the first part makes contact with the auxiliary electrode, and the portion of the first part makes contact with an exposing surface of the conductive thin film layer exposed through the first contact hole.

Additional aspects will be set forth in the detailed description which follows, and, in part, will be apparent from the disclosure, or may be learned by practice of the inventive concept.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
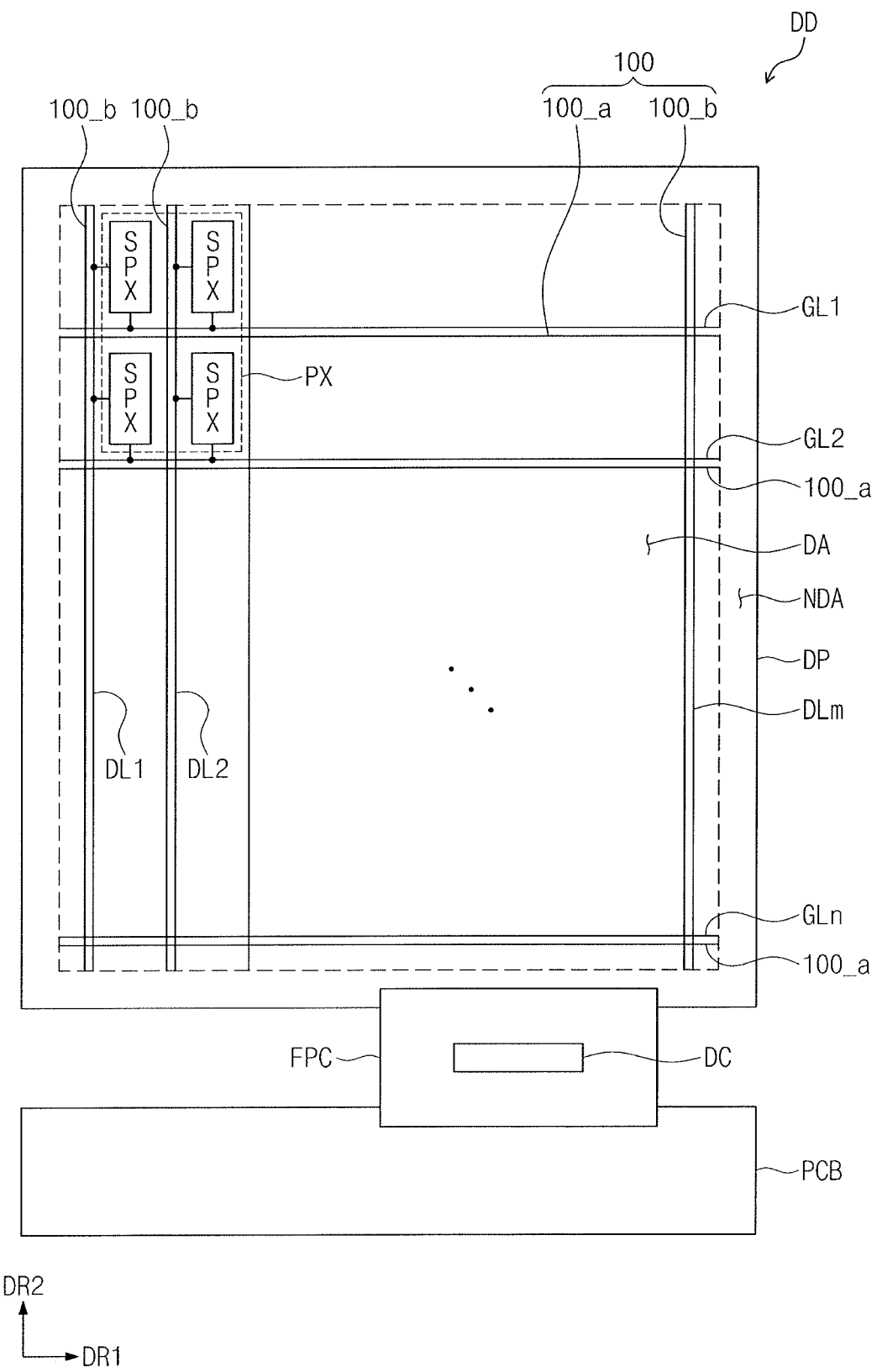
FIG. 1 illustrates a plan view of a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view showing a display device DD according to an exemplary embodiment of the present disclosure.

Referring to FIG. 1, the display device DD may include a display panel DP, a flexible printed circuit board FPC, and a printed circuit board PCB. The display panel DP displays an image through a display area DA. The display area DA is operated by a control signal and image data provided from the printed circuit board PCB.

The display panel DP includes gate lines GL1 to GLn, data lines DL1 to DLm, and sub-pixels SPX, which are arranged in the display area DA. The gate lines GL1 to GLn extend in a first direction DR1 and are arranged, e.g., spaced apart, in a second direction DR2. The data lines DL1 to DLm are insulated from the gate lines GL1 to GLn while crossing the gate lines. For instance, the data lines DL1 to DLm extend in the second direction DR2 and are arranged, e.g., spaced apart, in the first direction DR1. In the following descriptions, a direction substantially parallel to the first and second directions DR1 and DR2 may be referred to as a "horizontal direction".

The display panel DP includes a non-display area NDA surrounding the display area DA when viewed in a plan view. The sub-pixels SPX are not arranged in the non-display area NDA, and the image is not displayed through the non-display area NDA. The non-display area NDA may be referred to as a "bezel" of the display device DD.

Each of the sub-pixels SPX is connected to a corresponding gate line of the gate lines GL1 to GLn and a corresponding data line of the data lines DL1 to DLm. The sub-pixels SPX may be arranged in a matrix form along the first and second directions DR1 and DR2. Each sub-pixel SPX displays one of three primary colors of red, green, and blue colors. The colors displayed by the sub-pixels SPX are not be limited to red, green, and blue colors, and the sub-pixels SPX may display a second primary color of white, yellow, cyan, and magenta colors in addition to the red, green, and blue colors.

The sub-pixels SPX may form the pixel PX. As an example, four sub-pixels SPX may form one pixel PX, but the number of the sub-pixels SPX required to form one pixel PX is not be limited to four. That is, one pixel PX may include two, three, five, or more sub-pixels SPX.

The pixel PX serves as an element to display a unit image, and a resolution of the display panel DP is determined by the number of the pixels PX included in the display panel DP. FIG. 1 shows only one pixel PX, and the other pixels may have the same configurations as the one pixel PX. In the present exemplary embodiment, the display panel DP may be, but not limited to, an organic light emitting display panel, and each sub-pixel SPX may include an organic light emitting element.

The display panel DP may have, for example, a plate-like shape with a pair of short sides and a pair of long sides, which are respectively parallel to the first and second directions DR1 and DR2. In the present exemplary embodiment, the display panel DP may have various shapes. The display panel DP may have a shape curved in at least one direction when viewed in a cross-section, or the display panel DP may have at least one round-shaped edge when viewed in a plan view.

The flexible printed circuit board FPC connects the display panel DP and the printed circuit board PCB. FIG. 1 shows only one flexible printed circuit board FPC, but the flexible printed circuit board FPC may be provided in a plural number. The flexible printed circuit boards FPC may be arranged in an edge of the display panel along one direction. In the present exemplary embodiment, the number of the flexible printed circuit boards may vary.

As an example, the flexible printed circuit board FPC includes a driving chip DC. The driving chip DC is mounted in a tape carrier package (TCP) manner and includes a chip implemented as a data driver. The driving chip DC may further include a chip implemented as a gate driver. In addition, the gate driver may be disposed in the non-display area NDA.

The printed circuit board PCB includes a controller to control the display panel DP. The controller receives input image signals and converts a data format of the input image signals to a data format appropriate to an interface and a driving mode of the data driver, the gate driver, and the display panel DP to generate the image data. The controller outputs the image data and the control signal. The image data include information with respect to the image displayed in the display area DA.

The data driver receives the image data and the control signal. The data driver converts the image data to data voltages in response to the control signal and applies the data voltages to the data lines DL1 to DLm. The data voltages may be analog voltages corresponding to the image data.

Various electronic devices may be mounted on the printed circuit board PCB to implement the controller. For instance, the printed circuit board PCB may include a passive device, e.g., a capacitor, a resistor, etc., an active device, e.g., a microprocessor including an integrated circuit, a memory chip, etc., and lines connecting them.

The display panel DP may further include an auxiliary electrode 100. The auxiliary electrode 100 may be disposed between the sub-pixels SPX when viewed in a plan view.

The auxiliary electrode 100 may have, for example, a grid shape. The auxiliary electrode 100 includes a plurality of first extension parts 100_a and a plurality of second extension parts 100_b. The first extension parts 100_a extend in the first direction DR1 and are arranged in the second direction DR2. The second extension parts 100_b extend in the second direction DR2 and are arranged in the first direction DR1. The first and second extension parts 100_a and 100_b may be disposed every one sub-pixel SPX along the first and second directions DR1 and DR2, e.g., each of the first extension parts 100_a may be disposed along corresponding rows of sub-pixel SPX in a one-to-one correspondence, and each of the second extension parts 100_b may be disposed along corresponding columns of sub-pixels SPX in a one-to-one correspondence. However, embodiments are not limited thereto or thereby, e.g., the first and second extension parts 100_a and 100_b may be disposed every two sub-pixels SPX along the first and second directions DR1 and DR2.

The auxiliary electrode 100 may prevent an IR-drop from occurring in the display panel DP. The IR-drop will be described in detail later.

Figure 2:
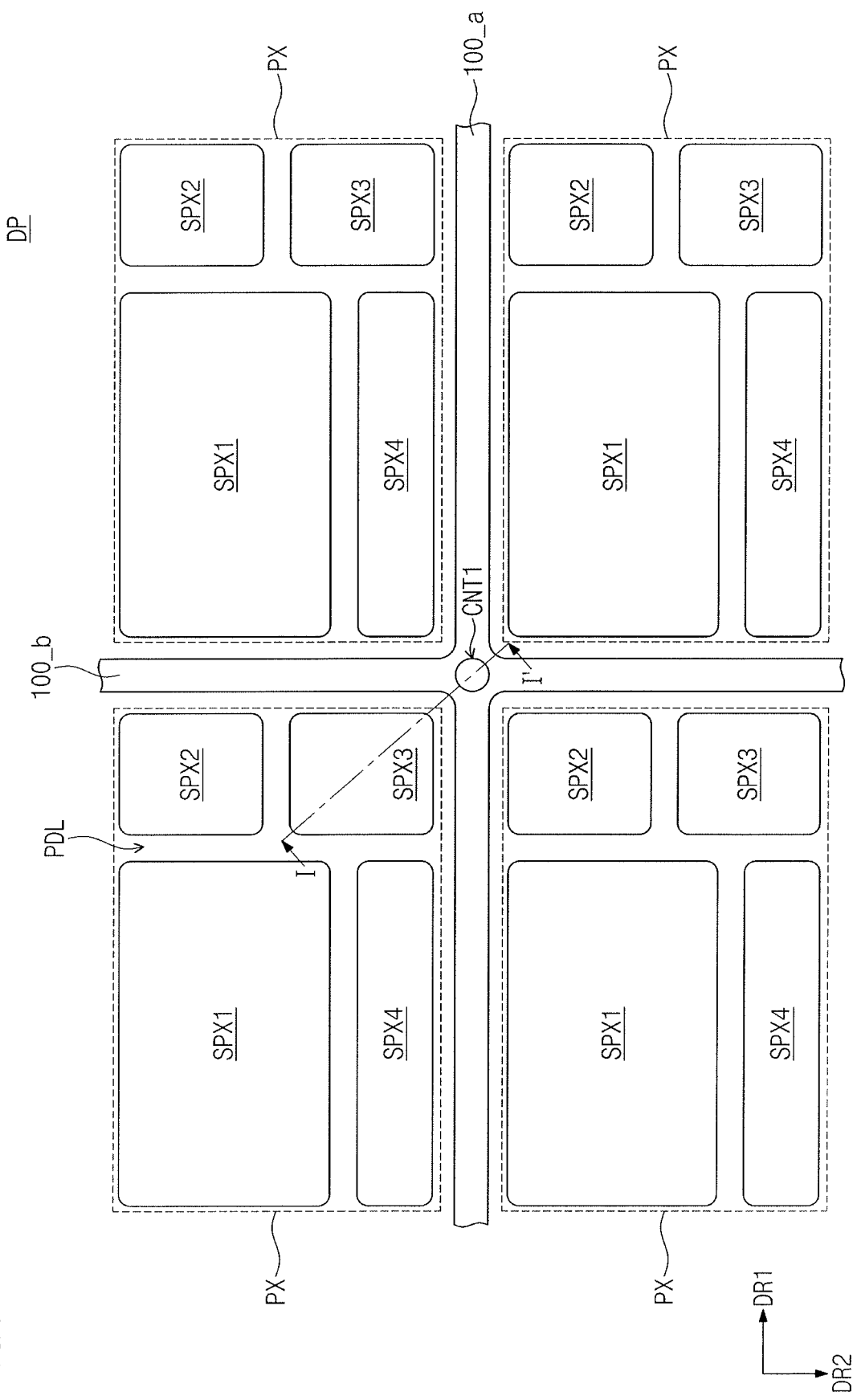
FIG. 2 illustrates a plan view of a display panel according to an exemplary embodiment of the present disclosure.
Figure 3A:
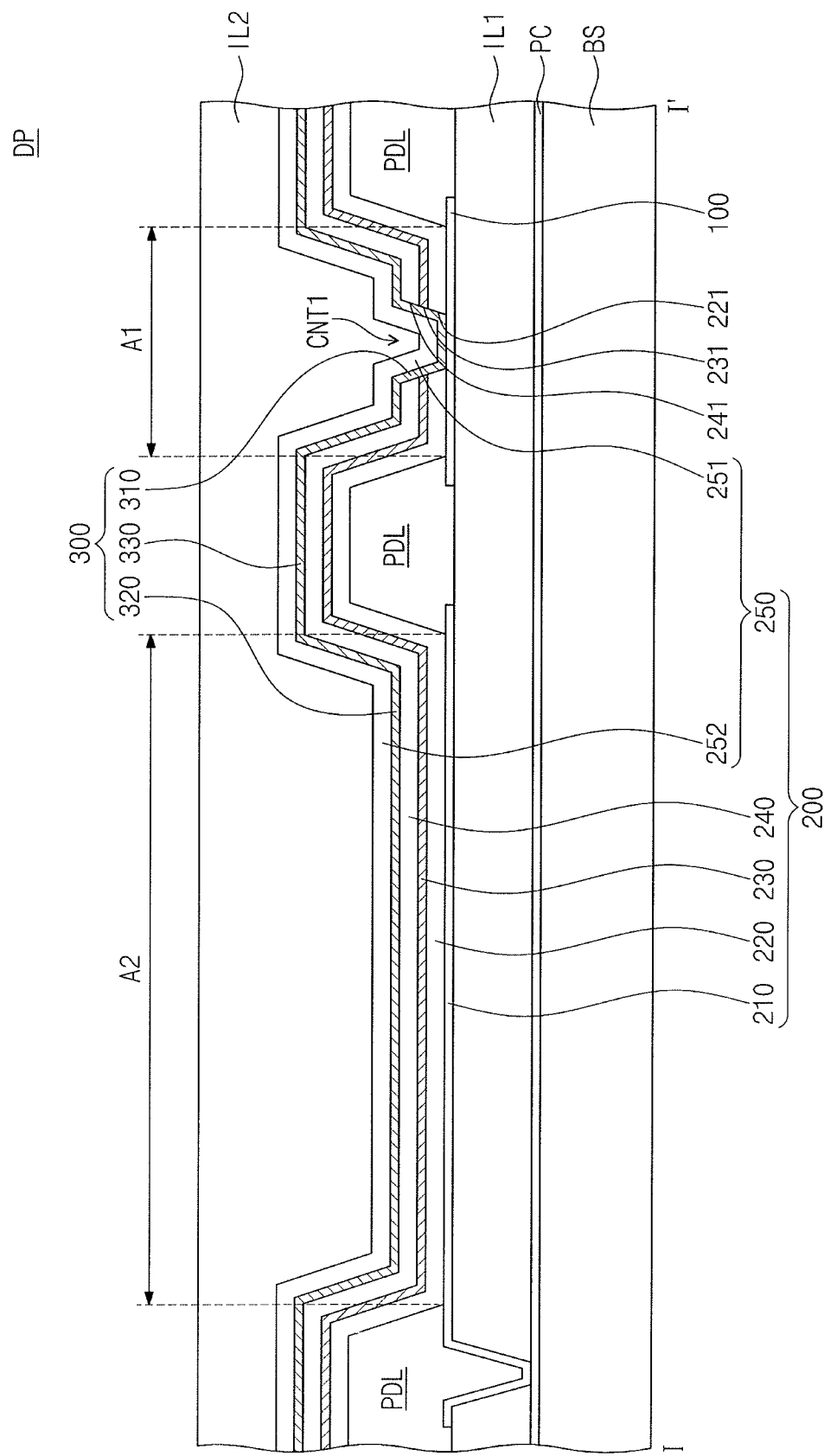
FIG. 3A illustrates a cross-sectional view along line I-I' in FIG. 2.
Figure 3B:
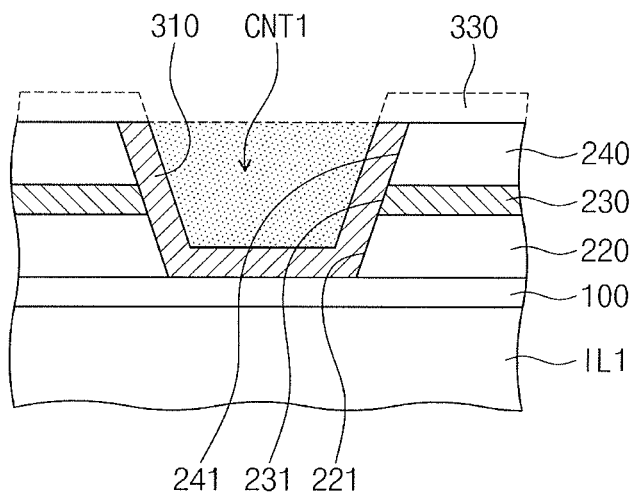
FIG. 3B illustrates an enlarged cross-sectional view of a first contact hole shown in FIG. 3A.
Figure 3C:
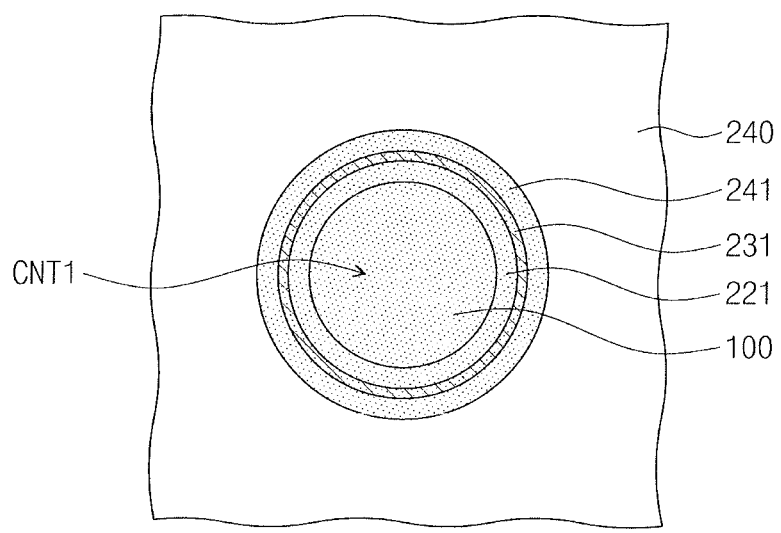
FIG. 3C illustrates an enlarged cross-sectional view of the first contact hole shown in FIG. 3A.

FIG. 2 is a plan view showing a display panel according to an exemplary embodiment of the present disclosure, FIG. 3A is a cross-sectional view taken along line I-I' in FIG. 2, FIG. 3B is an enlarged cross-sectional view showing a first contact hole in FIG. 3A, and FIG. 3C is an enlarged cross-sectional view showing the first contact hole in FIG. 3A.

Referring to FIG. 2, each of the pixels PX may include first, second, third, and fourth sub-pixels SPX1, SPX2, SPX3, and SPX4. The first to fourth sub-pixels SPX1 to SPX4 correspond to an embodiment of the sub-pixels SPX shown in FIG. 1.

In the present exemplary embodiment, the first, second, third, and fourth sub-pixels SPX1, SPX2, SPX3, and SPX4 respectively correspond to red, green, blue, and white sub-pixels. Each of the first to fourth sub-pixels SPX1 to SPX4 may have, e.g., a substantially quadrangular shape.

In the present exemplary embodiment, the display panel DP may include a pixel definition layer PDL disposed between the first to fourth sub-pixels SPX1 to SPX4. The pixel definition layer PDL may define a boundary between the first to fourth sub-pixels SPX1 to SPX4 and a boundary between the pixels PX.

In the present exemplary embodiment, a first contact hole CNT1 is defined through the display panel DP. The first contact hole CNT1 is defined in an area in which the first and second extension parts 100_a and 100_b cross each other.

Referring to FIG. 3A, the display panel DP may include a base substrate BS, a pixel circuit layer PC, a first insulating layer IL1 an organic light emitting element 200, a insulating layer 300, and a second insulating layer IL2. The base substrate BS may be transparent and may include, e.g., a rigid glass or a flexible polymer.

The pixel circuit layer PC may be disposed on the base substrate BS. The pixel circuit layer PC may include a circuit to drive the organic light emitting element 200 and at least two transistors. The pixel circuit layer PC may include, e.g., a switching transistor turned on in response to a gate signal applied thereto to transmit the data voltage and a driving transistor applying a driving current corresponding to the data voltage from the switching transistor to the organic light emitting element 200.

The first insulating layer IL1 may be disposed on the pixel circuit layer PC. The first insulating layer IL1 may include a contact hole defined therethrough to expose a portion of the pixel circuit layer PC. The first insulating layer IL1 has a single- or multi-layer structure of an organic material or an inorganic material.

In the present exemplary embodiment, the organic light emitting element 200 may include a first electrode 210, a first light emitting unit 220, an conductive thin film layer 230, a second light emitting unit 240, and a second electrode 250.

In the present exemplary embodiment, the first electrode 210 may be disposed on the first insulating layer IL1. For example, a first end of the first electrode 210 makes contact with the pixel circuit layer PC through the contact hole in the first insulating layer IL1 to receive the driving current from the pixel circuit layer PC.

The base substrate BS includes a first area A1 and a second area A2 spaced apart from the first area A1 in a horizontal direction. A second end of the first electrode 210 extends from the first electrode 210 and is disposed in the second area A2.

The auxiliary electrode 100 is disposed in the first area A1. The auxiliary electrode 100 includes a conductive material. The auxiliary electrode 100 may be a transparent electrode, a semi-transparent electrode, or a non-transparent electrode (or a reflective electrode). In addition, the auxiliary electrode 100 may have a single-layer structure of a single material or plural different materials or a multi-layer structure of layers formed of different materials.

In the present exemplary embodiment, the pixel definition layer PDL is disposed on the auxiliary electrode 100 and the first electrode 210. The pixel definition layer PDL covers an edge of the auxiliary electrode 100 and exposes a center portion of the auxiliary electrode 100. A portion of the pixel definition layer PDL may be disposed between the first and second areas A1 and A2 when viewed in a plan view. The first area A1 may be defined to correspond to the center portion of the auxiliary electrode 100.

The pixel definition layer PDL may cover an edge of the first electrode 210 and expose a center portion of the first electrode 210. The second area A2 may be defined to correspond to the exposed center portion of the first electrode 210.

In the present exemplary embodiment, the first light emitting unit 220 is disposed on the pixel definition layer PDL, the first electrode 210, and the auxiliary electrode 100. The first light emitting unit 220 generates, e.g., a first light having a first color. The first light emitting unit 220 includes a plurality of organic layers.

In the present exemplary embodiment, the conductive thin film layer 230 may be disposed on the first light emitting unit 220. The conductive thin film layer 230 is disposed between the first and second light emitting units 220 and 240 to provide electric charges (electrons and/or holes) to the first and second light emitting units 220 and 240 and to control a balance of the electric charges.

In the present exemplary embodiment, the second light emitting unit 240 may be disposed on the conductive thin film layer 230. The second light emitting unit 240 generates, e.g., a second light having a second color. The second light emitting unit 240 includes a plurality of organic layers.

In the present exemplary embodiment, the organic light emitting element 200 may be, but is not limited to, a white organic light emitting element. A color obtained by mixing the first and second colors may be white, and the first and second colors may have a complementary color relationship with each other. The first and second lights may be mixed with each other to generate white light. For example, the first and second colors may be respectively blue and yellow colors, but they are not limited thereto or thereby, e.g., the first and second colors may be respectively red and green colors.

The second electrode 250 may be disposed on the insulating layer 300. The second electrode 250 includes a first electrode part 251 disposed in the first area A1 and a second electrode part 252 extending from the first electrode part 251 and disposed in the second area A2. In more detail, the first electrode part 251 and the second electrode part 252 are respectively overlapped with the auxiliary electrode 100 and the first electrode 210 when viewed in a plan view.

The second electrode 250 is disposed over the entire surface of the base substrate BS. Accordingly, the IR-drop occurs in the second electrode 250 along the horizontal direction, and a brightness of the pixel PX becomes different in accordance with a position of the display panel DP. To prevent the IR-drop from occurring, the second electrode 250 may be connected to the auxiliary electrode 100. Since the auxiliary electrode 100 is connected to the second electrode 250 through a first part 310 of the insulating layer 300, the IR-drop occurring in the second electrode 250 may be prevented from occurring or may be reduced.

In the present exemplary embodiment, the insulating layer 300 is disposed on the second light emitting unit 240, first, second, and third exposing surfaces 221, 231, and 241, and a portion of the auxiliary electrode 100. In the present exemplary embodiment, the insulating layer 300 includes the first part 310, a second part 320, and a third part 330.

In detail, at least a portion of the first part 310, i.e., a first portion of the first part 310, is disposed, e.g., conformally along sidewalls, in the first contact hole CNT1. Referring to FIGS. 3B and 3C, the first contact hole CNT1 is defined in the first area A1 and is disposed above the auxiliary electrode 100. The first contact hole CNT1 is defined through the first light emitting unit 220, the conductive thin film layer 230, and the second light emitting unit 240 to expose the auxiliary electrode 100. In FIGS. 3B and 3C, some elements are not shown for the convenience of explanation of the first contact hole CNT1 and the first part 310. For instance, the insulating layer 300 and layers disposed above the insulating layer 300 are not shown in FIG. 3C.

In the following descriptions, the expression "a contact hole is defined in a layer" means that a space obtained by partially removing the layer is defined as the contact hole. Accordingly, the first contact hole CNT1 may be defined by an empty space (an area hatched with dots in FIGS. 3B and 3C) formed by partially removing the first light emitting unit 220, the conductive thin film layer 230, and the second light emitting unit 240.

At least a portion of an upper surface of the auxiliary electrode 100, the first exposing surface 221 of the first light emitting unit 220, the second exposing surface 231 of the conductive thin film layer 230, and the third exposing surface 241 of the second light emitting unit 240 are exposed through the first contact hole CNT1. Since the first portion of the first part 310 is disposed in the first contact hole CNT1, the first portion of the first part 310 may be disposed only in an area surrounded by the first, second, and third exposing surfaces 221, 231, and 241.

The first portion of the first part 310 is disposed between the conductive thin film layer 230 and the first electrode part 251. A lower surface of the first portion of the first part 310 makes contact with the first, second, and third exposing surfaces 221, 231, and 241, and an upper surface of the first portion 310 makes contact with the first electrode part 251.

In the present exemplary embodiment, a second portion of the first part 310 is disposed between the first electrode part 251 and the auxiliary electrode 100 to electrically connect the first electrode part 251 to the auxiliary electrode 100. A lower surface of the second portion of the first part 310 makes contact with the auxiliary electrode 100. For example, referring to FIG. 3A, the second portion of the first part 310 is a portion extending in parallel to the base substrate BS, i.e., on a bottom of the first contact hole CNT1, on the auxiliary electrode 100, and the first portion of the first part 310 is a portion extending from the second portion along sidewalls of the first contact hole CNT1.

In the present exemplary embodiment, the second part 320 is disposed in the second area A2. The second part 320 is disposed on the second electrode part 252 and disposed between the second light emitting unit 240 and the second electrode part 252 in the second area A2.

In the present exemplary embodiment, the third part 330 is disposed between the first and second parts 310 and 320 when viewed in a plan view and connects the first and second parts 310 and 320. The third part 330 is disposed on the pixel definition layer PDL.

The insulating layer 300 prevents the lateral leakage current from flowing through the conductive thin film layer 230. If the insulating layer 300 were to be omitted, the conductive thin film layer 230 would directly contact the first electrode part 251 in the first contact hole CNT1, causing a first voltage applied to the first electrode part 251 to be applied to the conductive thin film layer 230, thereby causing lateral leakage current through the conductive thin film layer 230 in the first contact hole CNT1. Accordingly, the lateral leakage current could pass through the first light emitting unit 220. In addition, a leakage voltage could be applied in the second area A2 due to the lateral leakage current. The leakage voltage may be voltage obtained by voltage-dividing the voltage applied in the first contact hole CNT1 along a path of the lateral leakage current. The leakage voltage is greater than the voltage applied to the first electrode 210 and smaller than the first voltage.

If lateral leakage current and leakage voltage are applied in the second areas A2, light emission of the light emitted from the first light emitting unit 220 may be poor (hereinafter, referred to as a "poor light emission"). For instance, if lateral leakage current and leakage voltage are applied in the second areas A2, e.g., when the insulating layer 300 is omitted, when voltage corresponding to zero (0) grayscale level is applied to the first electrode 210, the first light emitting unit 220 may emit light or generate light corresponding to a grayscale level different from the grayscale level of the voltage applied to the first electrode 210.

In contrast, according to the present exemplary embodiment, the insulating layer 300 may insulate the conductive thin film layer 230 from the second electrode 250, thereby preventing the lateral leakage current and the leakage voltage between the conductive thin film layer 230 and the first electrode part 251, which in turn, prevents or substantially minimizes poor light emission from occurring in the organic light emitting element 200. In more detail, the first portion of the insulating layer 300 along a sidewall of the first contact hole CNT1 may, e.g., completely or partially, insulate the conductive thin film layer 230 from the second electrode 250.

In the case that the insulating layer 300 completely insulates the conductive thin film layer 230 from the second electrode 250, the lateral leakage current does not flow to the conductive thin film layer 230 from the first electrode part 251, and the leakage voltage is not applied to the first part 310. In the case that the insulating layer 300 partially insulates the conductive thin film layer 230 from the second electrode 250, a lateral leakage current equal to or smaller than a critical current may flow, and leakage voltage equal to or smaller than a critical voltage may be applied to the second part 320. When the leakage voltage is smaller than the critical voltage and the lateral leakage current is smaller than the critical current, the first light emitting unit 220 may not emit the light, e.g., may not emit light corresponding to voltage and/or current smaller than respective critical values.

The insulating layer 300 has a resistance determined such that poor light emission is prevented. The resistance of the insulating layer 300 is greater than a resistance of the conductive thin film layer 230. The insulating layer 300 has a thickness determined such that the first electrode part 251 is electrically connected to the auxiliary electrode 100 and the conductive thin film layer 230 is insulated from the first electrode part 251.

The thickness of the insulating layer 300 is in a range from about 1 nm to about 10 nm. The insulating layer 300 is required to have the above indicated thickness, and thus the insulating layer 300 may have an insulating function in the first area A1. In addition, it is preferred that the insulating layer 300 has the above indicated thickness to perform an electron injection/transport function or a hole injection/transport function in the second area A2. These will be described in detail with reference to FIG. 7. According to the above, in the present exemplary embodiment, the insulating layer 300 insulates the conductive thin film layer 230 from the second electrode 250, and thus poor light emission of the organic light emitting element 200 due to the lateral leakage current may be prevented from occurring, and the organic light emitting element 200 may be stably driven.

Each of the first and second electrodes 210 and 250 includes a conductive material. In more detail, each of the first and second electrodes 210 and 250 is a transparent electrode, a semi-transparent electrode, or a non-transparent electrode (or a reflective electrode). In addition, the first and second electrodes 210 and 250 may have a single-layer structure of a single material or plural different materials or a multi-layer structure of layers formed of different materials.

In the case that each of the first and second electrodes 210 and 250 is a transparent electrode or a semi-transparent electrode, each of the first and second electrodes 210 and 250 may include, for example, Li, Ca, LiF/Ca, LiF/Al, Al, Mg, BaF, Ba, Ag, a compound thereof, or a mixture thereof, e.g., a mixture of Ag and Mg, each which is optically thin, or a transparent metal oxide, e.g., indium tin oxide (ITO), indium zinc oxide (IZO), zinc oxide (ZnO), indium tin zinc oxide (ITZO), Mo, Ti, etc. In the case that each of the first and second electrodes 210 and 250 is a reflective electrode, each of the first and second electrodes 210 and 250 may include, e.g., Ag, Mg, Cu, Al, Pt, Pd, Au, Ni, Nd, Ir, Cr, Li, Ca, LiF/Ca, LiF/Al, Mo, Ti, a compound thereof, or a mixture thereof, e.g., a mixture of Ag and Mg, each which is optically thick.

In the present exemplary embodiment, the organic light emitting element 200 may be a rear surface light emitting type or a front surface light emitting type. In the case that the organic light emitting element 200 is a rear surface light emitting type, the first electrode 210 is provided as a transparent or semi-transparent electrode, and the second electrode 250 is a reflective electrode. In this case, white light exits to the outside through the first electrode 210. In the case that the organic light emitting element 200 is a front surface light emitting type, the first electrode 210 is provided as a reflective electrode, the second electrode 250 is a transparent or semi-transparent electrode, and accordingly, white light exits to the outside through the second electrode 250.

As an example, the organic light emitting element 200 may have a non-inverted structure or an inverted structure. When the organic light emitting element 200 has a non-inverted structure, the first electrode 210 is an anode, the second electrode 250 is a cathode, and a voltage applied to the first electrode 210 is greater than a voltage applied to the second electrode 250. On the contrary, when the organic light emitting element 200 has an inverted structure, the first electrode 210 is the cathode, the second electrode 250 is the anode, and the voltage applied to the first electrode 210 is smaller than the voltage applied to the second electrode 250.

Figure 3D:
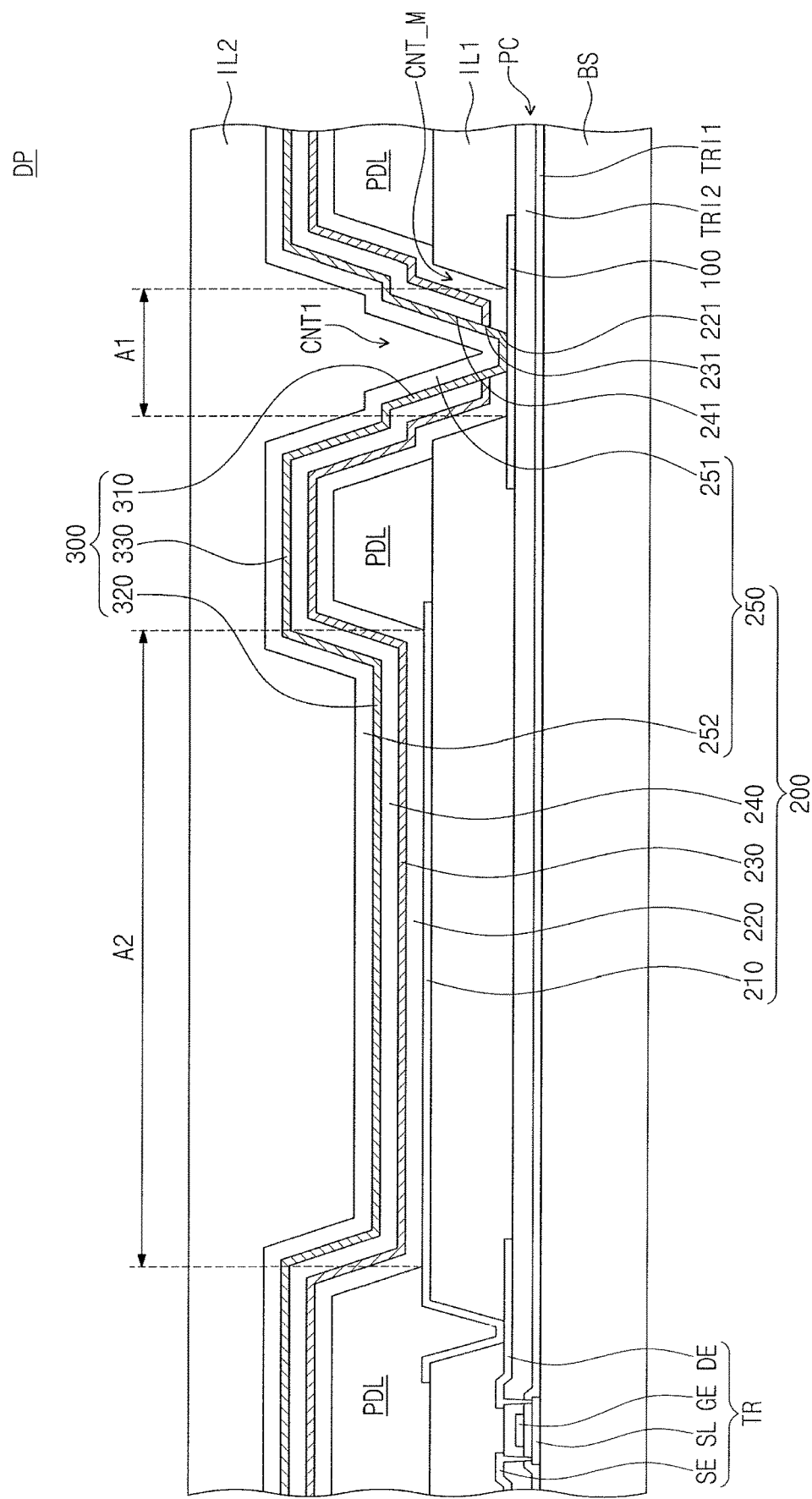
FIG. 3D illustrates a cross-sectional view of a display panel according to an exemplary embodiment of the present disclosure.

FIG. 3D is a cross-sectional view showing a display panel according to an exemplary embodiment of the present disclosure. The display panel DP in FIG. 3D is substantially the same as the display panel DP in FIG. 3A, with the exception of the first contact hole and the first part extending deeper than those in FIG. 3A.

Referring to FIG. 3D, the pixel circuit layer PC includes a transistor TR. The transistor TR includes a gate electrode GE, a source electrode SE, a drain electrode DE, and a semiconductor layer SL. The semiconductor layer SL is disposed on the base substrate BS. A first transistor insulating layer TRI1 is disposed on the semiconductor layer SL. A second transistor insulating layer TRI2 is disposed above the first transistor insulating layer TRI1. The source electrode SE and the drain electrode DE are disposed on the second transistor insulating layer TRI2 and spaced apart from each other.

The source electrode SE is connected to one end of the semiconductor layer SL through a contact hole defined through the first and second transistor insulating layers TRI1 and TRI2, and the drain electrode DE is connected to the other end of the semiconductor layer SL through a contact hole defined through the first and second transistor insulating layers TRI1 and TRI2. The transistor TR applies voltage applied to the source electrode SE to the first electrode 210 through the drain electrode DE in response to a control signal applied to the gate electrode GE.

The auxiliary electrode 100 is disposed between the first insulating layer IL1 and the second transistor insulating layer TRI2, and the first insulating layer IL1 includes an intermediate contact hole CNT_M defined therethrough to expose the auxiliary electrode 100. That is, the upper surface of the auxiliary electrode 100 is exposed through the intermediate contact hole CNT_M. Portions of the first and second light emitting units 220 and 240 and the conductive thin film layers 230, which are disposed in the first area A1, are disposed in the intermediate contact hole CNT_M.

The first contact hole CNT1 is defined through the portions of the first and second light emitting units 220 and 240 and the conductive thin film layers 230, which are disposed in the intermediate contact hole CNT_M. The upper surface of the auxiliary electrode 100 is exposed through the first contact hole CNT1. For example, as illustrated in FIG. 3D, the first and intermediate contact holes CNT1 and CNT_M may be in fluid communication with each other, e.g., portions of the first light emitting unit 220 may extend along sidewalls of the first contact hole CNT1 and continuously extend along sidewall of the intermediate contact hole CNT_M. For example, as further illustrated in FIG. 3D, the intermediate contact hole CNT_M may be between the first contact hole CNT1 and sidewalls of the first insulating layer IL1, e.g., the intermediate contact hole CNT_M may extend radially from the first contact hole CNT1 toward the sidewalls of the first insulating layer IL1.

In the present exemplary embodiment, the first part 310 of the insulating layer 300 is disposed in the first contact hole CNT1. At least the portion of an upper surface of the auxiliary electrode 100, the first exposing surface 221 of the first light emitting unit 220, the second exposing surface 231 of the conductive thin film layer 230, and the third exposing surface 241 of the second light emitting unit 240 are exposed through the first contact hole CNT1. Since the first part 310 is disposed in the first contact hole CNT1, the first part 310 may be disposed only in the area surrounded by the first, second, and third exposing surfaces 221, 231, and 241 and the first electrode part 251.

The first portion of the first part 310, e.g., on sidewalls of the first contact hole CNT1, is disposed between the conductive thin film layer 230 and the first electrode part 251. A lower surface of the portion of the first part 310 makes contact with the first, second, and third exposing surfaces 221, 231, and 241, and an upper surface of the first portion 310 makes contact with the first electrode part 251. In the present exemplary embodiment, the second portion of the first part 310, e.g., on a bottom of the first contact hole CNT1, is disposed between the first electrode part 251 and the auxiliary electrode 100 to electrically connect the first electrode part 251 to the auxiliary electrode 100. A lower surface of the second portion of the first part 310 makes contact with the auxiliary electrode 100. In addition, according to another embodiment, the auxiliary electrode 100 may be disposed between the first and second transistor insulating layers TRI1 and TRI2. The first contact hole CNT1 is defined in the first transistor insulating layer TRI1 to expose the upper surface of the auxiliary electrode 100, and the first portion 310 may be disposed in the first contact hole CNT1.

Figure 4:
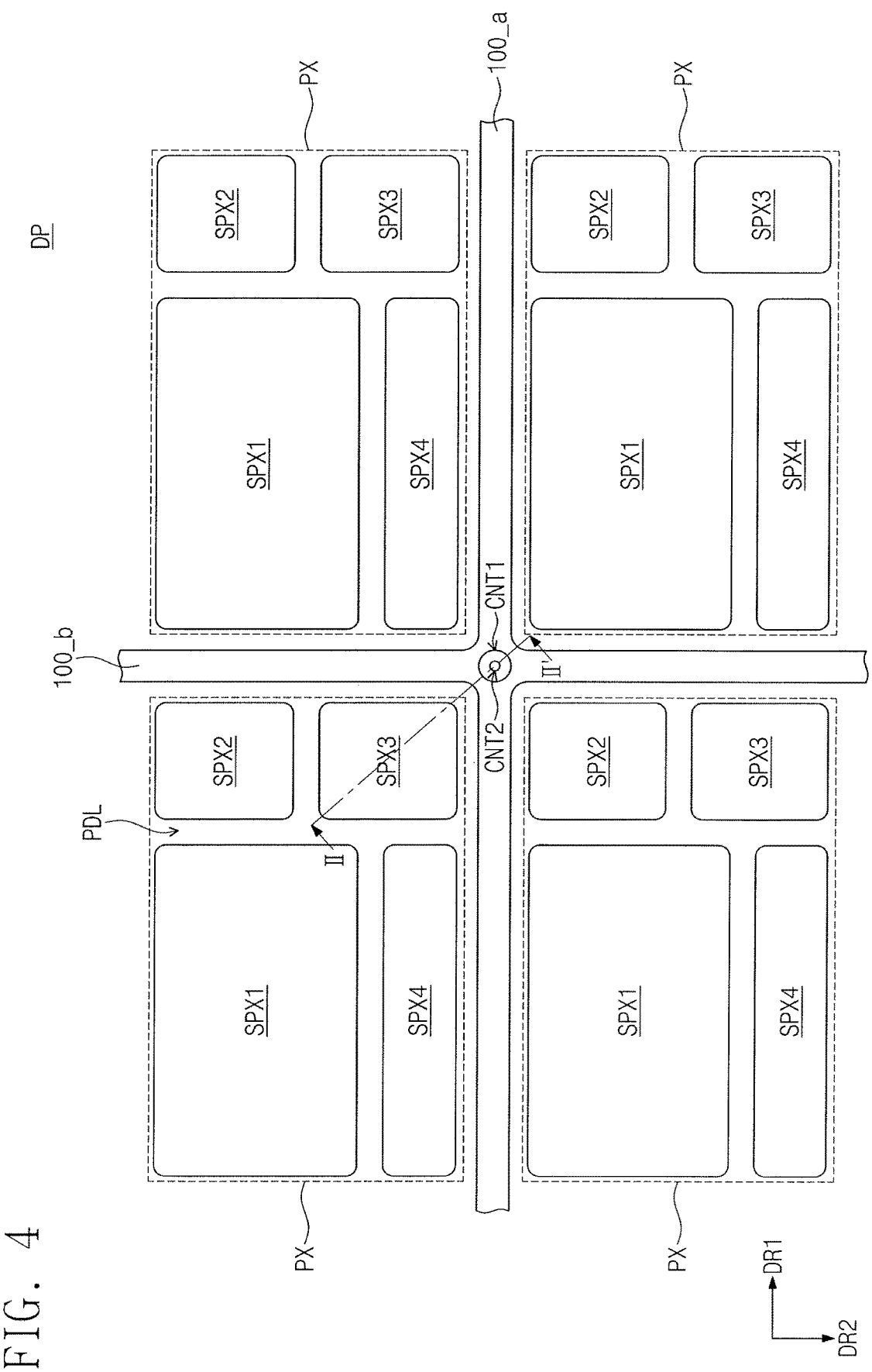
FIG. 4 illustrates a plan view of a display panel according to an exemplary embodiment of the present disclosure.
Figure 5:
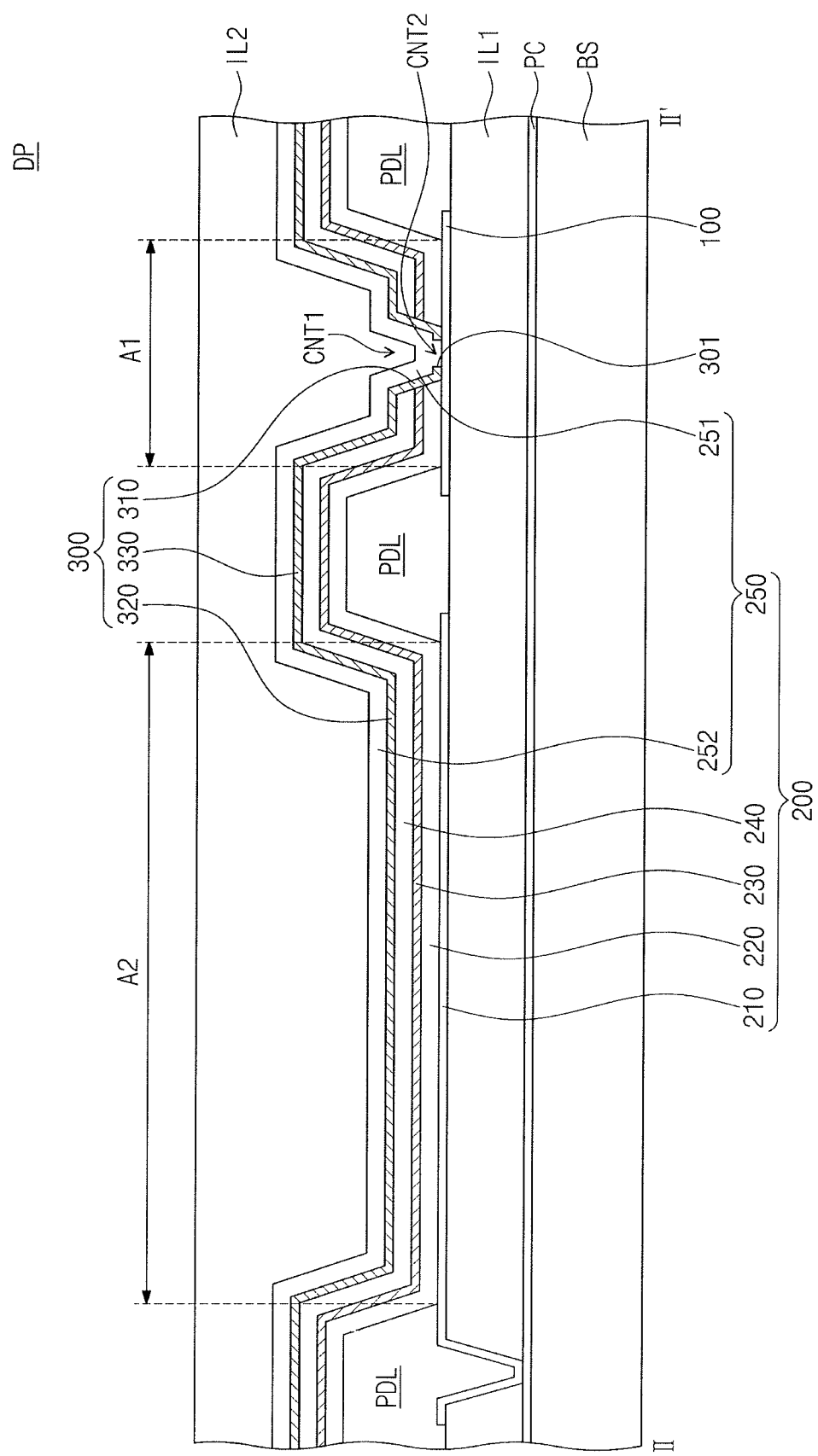
FIG. 5 illustrates a cross-sectional view along line in FIG. 2.

FIG. 4 is a plan view showing a display panel according to an exemplary embodiment of the present disclosure, and FIG. 5 is a cross-sectional view taken along line in FIG. 2. The display panel DP in FIGS. 4 and 5 is substantially the same as the display panel DP shown in FIGS. 2-3, except for a second contact hole CNT2 and the conductive thin film layer. Thus different features of the second contact hole CNT2 and the conductive thin film layer will be mainly described, and details of the others will be omitted.

Referring to FIG. 4, the second contact hole CNT2 may be further defined in the display panel DP. The second contact hole CNT2 may be defined in the first contact hole CNT1 when viewed in a plan view.

Referring to FIG. 5, the second contact hole CNT2 is defined in the first area A1 above the auxiliary electrode 100. The second contact hole CNT2 is defined through the insulating layer 300. In more detail, the second contact hole CNT2 is defined in the first part 310, and at least a portion of an upper surface of the auxiliary electrode 100 and a fourth exposing surface 301 of the insulating layer 300 are exposed through the second contact hole CNT2.

In the present exemplary embodiment, at least a portion of the first electrode part 251 is disposed in the second contact hole CNT2 and makes contact with the portion of the auxiliary electrode 100 exposed through the second contact hole CNT2. As described above, since the second electrode 250 is directly connected to the auxiliary electrode 100, a voltage drop does not occur between the second electrode 250 and the auxiliary electrode 100. Accordingly, the IR-drop may be effectively prevented, and a voltage-current characteristic of the organic light emitting element 200 may be improved.

Figure 6:
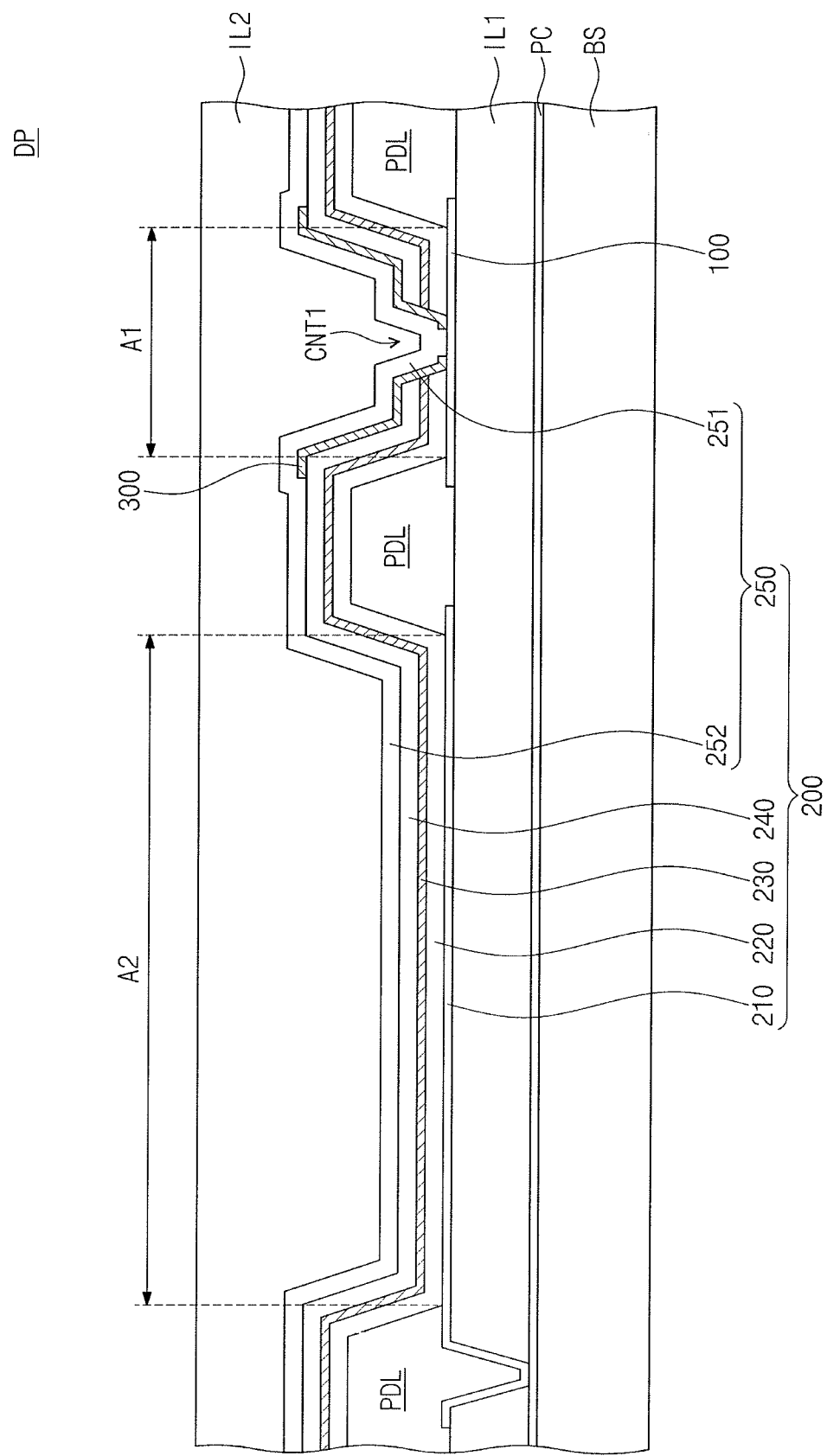
FIG. 6 illustrates a cross-sectional view of a display panel according to an exemplary embodiment of the present disclosure.

FIG. 6 is a cross-sectional view showing a display panel according to an exemplary embodiment of the present disclosure. The display panel DP in FIG. 6 is substantially the same as the display panel DP shown in FIG. 5, except for the insulating layer. Thus different features of the insulating layer will be mainly described, and details of the others will be omitted.

Referring to FIG. 6, the insulating layer 300 is not disposed in the second area A2. The insulating layer 300 is disposed spaced apart from the second area A2 without being overlapped with the second area A2 when viewed in a plan view. In other words, the second and third parts 320 and 330 may be omitted.

In the present exemplary embodiment, the insulating layer 300 is not disposed between organic layers of the organic light emitting element 200 in the second area A2. Accordingly, the insulating layer 300 does not exert an influence on the balance of electric charge and the voltage-current characteristic of the organic light emitting element 200. Thus, a design of the organic light emitting element 200 to maintain the electric charge balance and a design of the insulating layer 300 to prevent the lateral leakage current from occurring may be independently performed.

Figure 7:
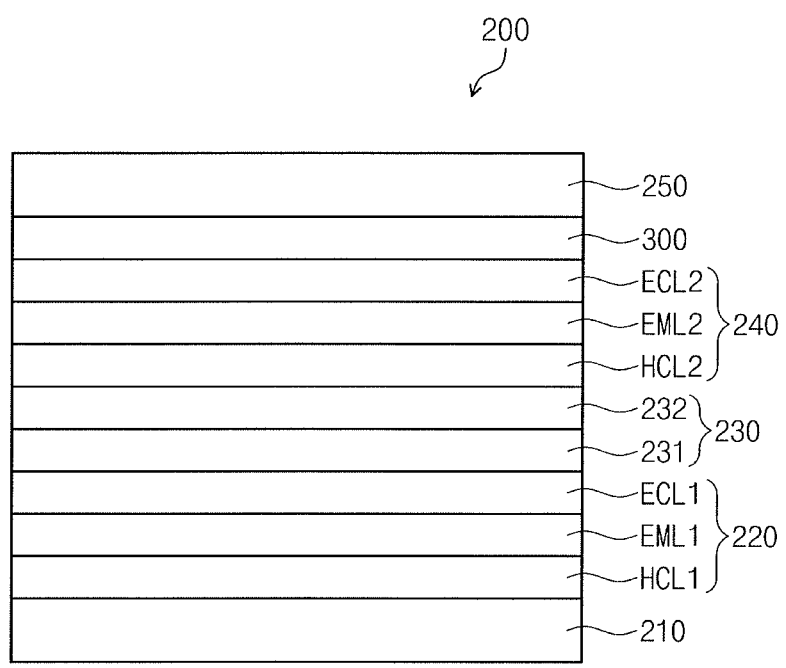
FIG. 7 illustrates a schematic cross-sectional view of an organic light emitting element according to an exemplary embodiment of the present disclosure.

FIG. 7 is a schematic cross-sectional view of the organic light emitting element 200.

Referring to FIG. 7, the first light emitting unit 220 includes a first hole control layer HCL1, a first light emitting layer EML1, and a first electron control layer ECL1. The second light emitting unit 240 includes a second hole control layer HCL2, a second light emitting layer EML2, and a second electron control layer ECL2.

The first and second light emitting layers EML1 and EML2 are disposed between the first electrode 210 and the second electrode 250. In the present exemplary embodiment, each of the first and second light emitting layers EML1 and EML2 includes a host material and a dopant material. Each of the first and second light emitting layers EML1 and EML2 is formed by applying a fluorescent material or a phosphorescent material to the host material.

As the host, for example, Alq3(tris(8-hydroxyquinolino) aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl) benzene), TBADN(3-tert-butyl-9,10-di(naphth-2-yl) anthracene), DSA(distyrylarylene), CDBP(4,4'-bis(9-carbazolyl)-2,2"-dimethyl-biphenyl), MADN(2-Methyl-9, 10-bis(naphthalen-2-yl)anthracene) may be used. However, embodiments are not limited thereto or thereby.

Colors of the light emitting layers may be determined by a combination of the host material and the dopant material. For instance, when the light emitting layers emit red light, the light emitting layers may include a fluorescent material containing, e.g., PBD:Eu(DBM)3(Phen)(tris(dibenzoylmethanato)phenanthoroline europium) or Perylene. When the light emitting layers emit the red light, the dopant included in the organic light emitting layers may be a metal complex, e.g., PIQIr(acac)(bis(1-phenylisoquinoline)acetylacetonate iridium), PQIr(acac)(bis(1-phenylquinoline) acetylacetonate iridium), PQIr(tris(1-phenylquinoline) iridium), PtOEP(octaethylporphyrin platinum), etc., or organometallic complex.

When the light emitting layers emit green light, the light emitting layers may include a fluorescent material containing, e.g., Alq3(tris(8-hydroxyquinolino)aluminum). When the light emitting layers emit the green light, the dopant included in the light emitting layers may be a metal complex, e.g., Ir(ppy)3(fac-tris(2-phenylpyridine)iridium), or organometallic complex.

When the light emitting layers emit blue light, the light emitting layers may include a fluorescent material including, e.g., any one from the groups consisting of spiro-DPVBi, spiro-6P, DSB(distyryl-benzene), DSA(distyryl-arylene), PFO(Polyfluorene)-based polymer, and PPV(poly(p-phenylene vinylene)-based polymer. When the light emitting layers emits blue light, the dopant included in the light emitting layers may be a metal complex, e.g., (4,6-F2ppy)2Irpic, or organometallic complex.

The first light emitting layer EML1 generates light having a wavelength shorter than a wavelength of a light generated by the second light emitting layer EML2. As described above, the first light may be the blue light and have a wavelength range equal to or greater than about 450 nm and equal to or smaller than about 595 nm. As described above, the second light may be the yellow light and have a wavelength range equal to or greater than about 570 nm and equal to or smaller than about 590 nm.

Meanwhile, the first and second light emitting layers EML1 and EML2 may be designed to generate lights having various colors according to embodiments. The first and second light emitting layers EML1 and EML2 may be formed by various methods, e.g., a vacuum deposition method, a spin coating method, a cast method, an LB (Langmuir-Blodgett) method, an inkjet printing method, a laser printing method, an LITI (Laser Induced Thermal Imaging) method, etc.

The conductive thin film layer 230 is disposed between the first and second light emitting layers EML1 and EML2 to improve a current efficiency and a light efficiency of the organic light emitting element 200. When voltage is applied to the conductive thin film layer 230, the conductive thin film layer 230 generates electric charges by a complex formation due to oxidation-reduction reaction.

In the present exemplary embodiment, the conductive thin film layer 230 may include first and second conductive thin film layers 231 and 232 sequentially stacked. The first and second conductive thin film layers 231 and 232 may be respectively N-type and P-type conductive thin film layers. The N-type conductive thin film layer may include an alkali metal, e.g., Li, Na, K, Cs, or the like, or an organic layer doped with an alkali earth metal, e.g., Mg, Sr, Ba, Ra, or the like, but it should not be limited thereto or thereby. The P-type conductive thin film layer may include an organic layer with a P-type dopant, but it should not be limited thereto or thereby.

The first hole control layer HCL1 is disposed between the first electrode 210 and the first light emitting layer EML1. The second hole control layer HCL2 is disposed between the electric charge layer 230 and the second light emitting layer EML2.

When the first electrode 210 is an anode electrode layer, holes injected from the first electrode 210 are provided to the first light emitting layer EML1 through the first hole control layer HCL1. The holes generated by the conductive thin film layer 230 are provided to the second light emitting layer EML2 through the second hole control layer HCL2.

Each of the first and second hole control layers HCL1 and HCL2 may correspond to at least one of a hole injection area, a hole transport area, a buffer area, and an electron block area. Each of the first and second hole control layers HCL1 and HCL2 may have a single-layer structure of a single material or plural different materials or a multi-layer structure of layers formed of different materials.

For instance, each of the first and second hole control layers HCL1 and HCL2 may include at least one of a hole injection layer corresponding to the hole injection layer, a hole transport layer corresponding to the hole transport area, and a single layer having a hole injection function and a hole transport function.

Each of the first and second hole control layers HCL1 and HCL2 may include at least one of a hole injection material and a hole transport material. The hole injection material and the hole transport material may be known materials.

The hole transport material may include, but not limited to, e.g., carbazole-based derivatives, e.g., n-phenyl carbazole, polyvinyl carbazole, etc., fluorine-based derivatives, triphenylamine-based derivatives, e.g., TPD(N,N'-bis(3-methylphenyl)-N,N'-diphenyl-[1,1-biphenyl]-4,4'-diamine), TCTA(4,4',4''-tris(N-carbazolyl)triphenylamine), etc., NPB (N,N'-di(1-naphthyl)-N,N'-diphenylbenzidine), or TAPC(4,4'-Cyclohexylidene bis[N,N-bis(4-methylphenyl)benzenamine]). The hole injection material may include, but not limited to, at least one of a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4',4''-tris(3-methylphenylphenylamino) triphenylamine), TDATA(4,4'4''-Tris(N,N-diphenylamino)triphenylamine), 2TNATA(4,4',4''-tris{N-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate), etc.

Each of the first and second hole control layers HCL1 and HCL2 may be formed by similar process of forming the first and second light emitting layers EML1 and EML2. For instance, each of the first and second hole control layers HCL1 and HCL2 may be formed by various methods, e.g., a vacuum deposition method, a spin coating method, a cast method, an LB (Langmuir-Blodgett) method, an inkjet printing method, a laser printing method, an LITI (Laser Induced Thermal Imaging) method, etc.

Meanwhile, each of the first and second hole control layers HCL1 and HCL2 may include a hole block layer corresponding to the hole block area. In this case, each of the first and second hole control layers HCL1 and HCL2 may include a hole block material. In addition, each of the first and second hole control layers HCL1 and HCL2 may further include an electric charge generating material.

The first electron control layer ECL1 is disposed between the first light emitting layer EML1 and the conductive thin film layer 230. The electrons generated by the conductive thin film layer 230 are provided to the first light emitting layer EML1 through the first electron control layer ECL1.

The second electron control layer ECL2 is disposed between the second light emitting layer EML2 and the second electrode 250. When the second electrode 250 is a cathode electrode layer, the electrons injected from the second electrode 250 are provided to the second light emitting layer EML2 through the insulating layer 300 and the second electron control layer ECL2.

Each of the first and second electron control layers ECL1 and ECL2 may correspond to at least one of an electron injection area, an electron transport area, and a hole block area. Each of the first and second electron control layers ECL1 and ECL2 may have a single-layer structure of a single material or plural different materials or a multi-layer structure of layers formed of different materials.

For instance, each of the first and second electron control layers ECL1 and ECL2 may include at least one of an electron injection layer corresponding to the electron injection layer, an electron transport layer corresponding to the electron transport area, and a single layer having an electron injection function and an electron transport function.

Each of the first and second electron control layers ECL1 and ECL2 may include at least one of an electron transport material and an electron injection material. For instance, the electron transport material may include, but not limited to, Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate), ADN(9,10-di(naphthalene-2-yl) anthracene), or a compound thereof.

In addition, the electron injection material may include a lanthanide-based metal, e.g., LiF, LiQ (Lithium quinolate), Li$_2$O, BaO, NaCl, CsF, Yb, etc., or a metal halide, e.g., RbCl, RbI, etc., but it should not be limited thereto or thereby. The electron transport layer may include a mixture of an electron transport material and an organo metal salt with insulating property.

The organo metal salt has an energy band gap of about 4 eV or more. In detail, the organo metal salt may include, e.g., metal acetate, metal benzoate, metal acetoacetate, metal acetylacetonate, or metal stearate.

Each of the first and second electron control layers ECL1 and ECL2 may be formed by various methods, e.g., a vacuum deposition method, a spin coating method, a cast method, an LB (Langmuir-Blodgett) method, an inkjet printing method, a laser printing method, an LITI (Laser Induced Thermal Imaging) method, etc.

The organic light emitting element 200 according to the present disclosure should not be limited to the above-mentioned structure and function. For instance, the organic light emitting element 200 may include three light emitting units and two conductive thin film layers interposed between the three light emitting units. In this structure, the insulating layer 300 may insulate the two conductive thin film layers from the second electrode 250.

As an example, the insulating layer 300 corresponds to a separate component disposed on the second light emitting unit 240, but the present disclosure should not be limited thereto or thereby. That is, the insulating layer 300 may be provided as a layer that performs a function of the second light emitting unit 240. For instance, the insulating layer 300 may correspond to the electron injection area, and the second electron control layer ECL2 of the second light emitting unit 240 may include the electron transport area and the hole block area. In this structure, the insulating layer 300 may perform a function of the electron injection area of the second light emitting unit 240. Similarly, the insulating layer 300 may be not only the electron injection area but also the electron transport area and the hole block area. In addition, in the case that the organic light emitting element 200 has the inverted structure, the insulating layer 300 may be one of the hole injection area, the hole transport area, and the electron block area.

The insulating layer 300 may include, for example, at least one of LiQ and LiF. As an example, in the non-inverted structure, the insulating layer 300 may include the host material of the first and second hole control layers HCL1 and HCL2 to block the injection/transport of the electrons or a material of the first and second electron control layers ECL1 and ECL2, which has a low electron conductivity. Accordingly, the electrons injected from the first electrode part 251 that is the cathode are blocked, and thus the lateral leakage current may be effectively prevented.

The insulating layer 300 has a thickness of about 1 nm to about 10 nm. When the thickness of the insulating layer 300 is smaller than about 1 nm, the insulating layer 300 may not be sufficiently thick to properly perform an insulating function with respect to the conductive thin film layer 230 in the first area A1 (refer to FIG. 3A). When the thickness of the insulating layer 300 exceeds about 10 nm, the insulating layer 300 may be too thick to perform the function of the electron injection/transport with respect to the second light emitting unit 240 in the second area A2 (refer to FIG. 3A).

As an example, in the inverted structure, the insulating layer 300 may include the host material of the first and second electron control layers ECL1 and ECL2 to block the injection/transport of the holes or a material of the first and second hole control layers HCL1 and HCL2, which has a low hole conductivity. Accordingly, the holes injected from the first electrode part 251 that is the anode are blocked, and thus the lateral leakage current may be effectively prevented.

FIGS. 8A to 8F are cross-sectional views showing stages in a method of manufacturing a display panel according to an exemplary embodiment.

Figure 8A:
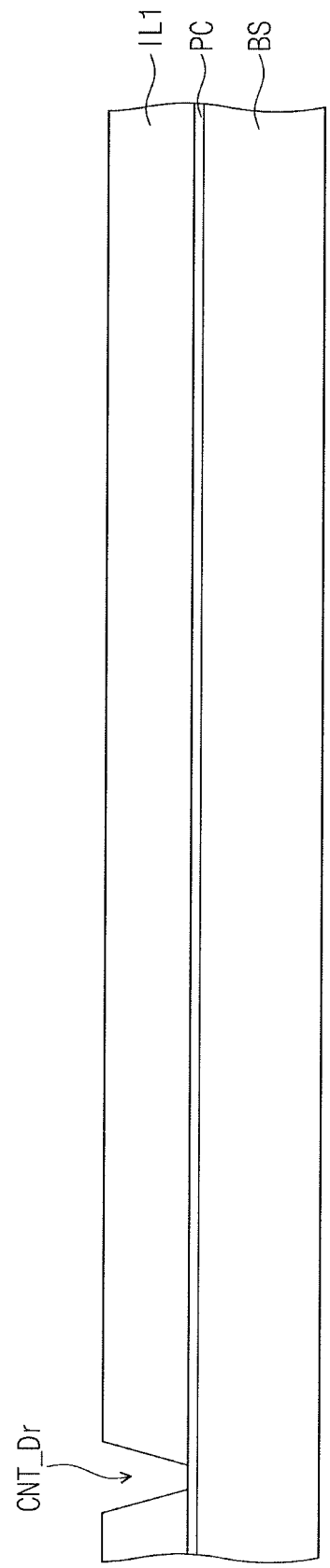
FIGS. 8A, 8B, 8C, 8D, 8E, and 8F illustrate cross-sectional views of stages in a method of manufacturing a display panel according to an exemplary embodiment.

Referring to FIG. 8A, the pixel circuit layer PC is formed on the base substrate BS, and the first insulating layer IL1 is formed on the pixel circuit layer PC. A driving contact hole CNT_Dr is formed through the first insulating layer IL1. A portion of the pixel circuit layer PC is exposed through the driving contact hole CNT_Dr.

Figure 8B:
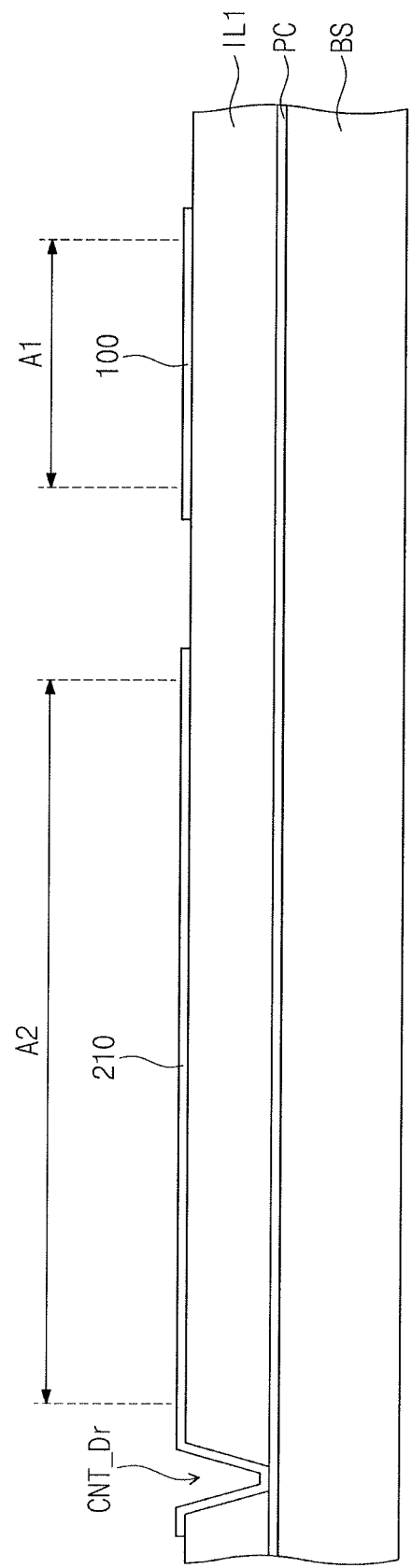

Referring to FIG. 8B, the first electrode 210 and the auxiliary electrode 100 are formed on the first insulating layer IL1. As described above, the first end of the first electrode 210 is disposed in the driving contact hole CNT_Dr formed through the first insulating layer IL1 and makes contact with the pixel circuit layer PC. The second end of the first electrode 210 extends from the first end of the first electrode 210 and is disposed in the second area A2. The auxiliary electrode 100 is spaced apart from the first electrode 210 and disposed in the first area A1.

Figure 8C:
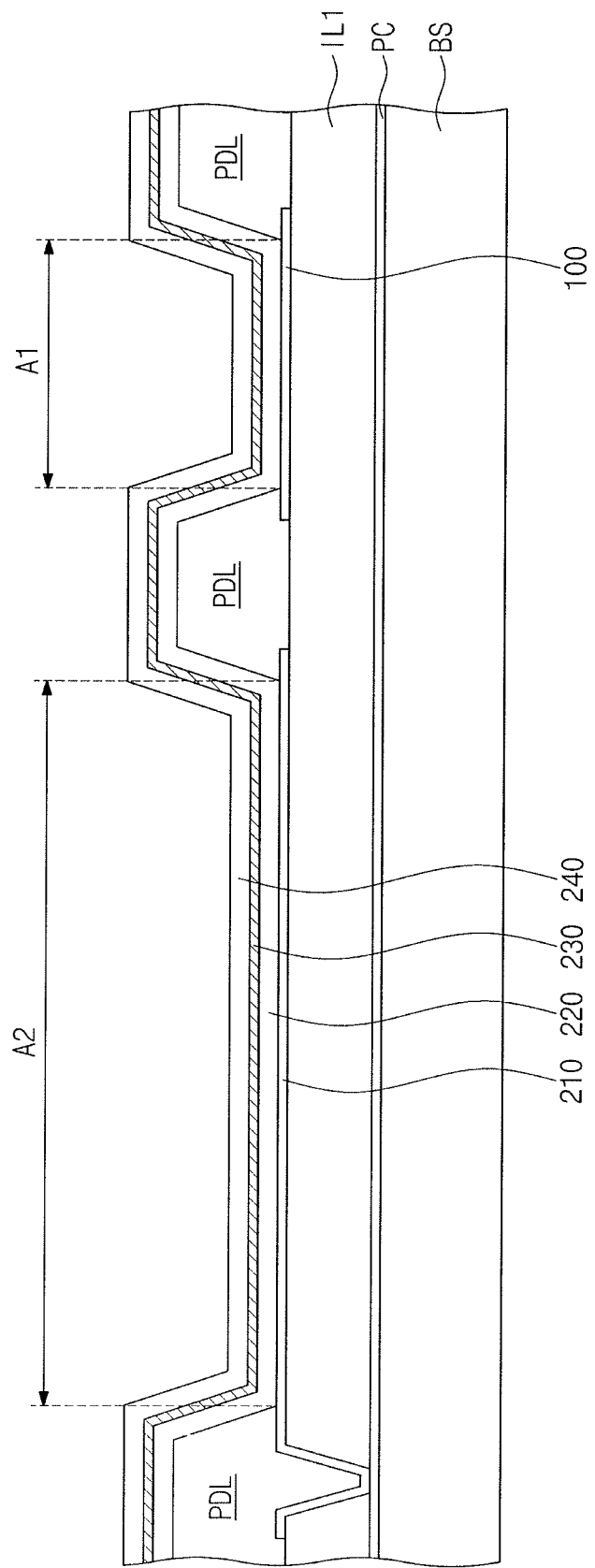

As shown in FIG. 8C, the pixel definition layer PDL is formed on the first electrode 210 and the auxiliary electrode 100. Then, the first light emitting unit 220, the conductive thin film layer 230, and the second light emitting unit 240 are sequentially formed on the pixel definition layer PDL, the first electrode 210, and the auxiliary electrode 100.

Figure 8D:
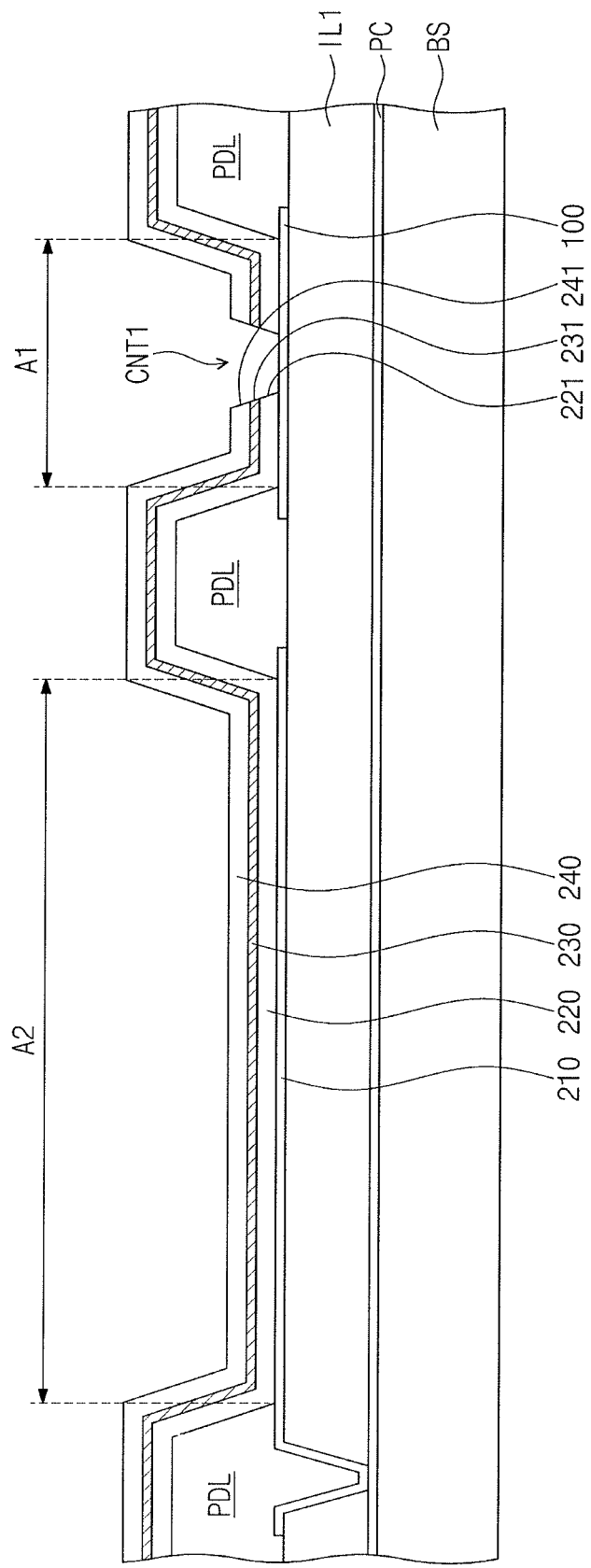

Referring to FIG. 8D, the first contact hole CNT1 is formed in the first area A1. The first contact hole CNT1 is formed by removing portions (hereinafter, referred to as "removed layers") of the first light emitting unit 220, the conductive thin film layer 230, and the second light emitting unit 240 in the first area A1 to expose a portion, e.g., of the upper surface, of the first auxiliary electrode 100. As an example, since the removed layers are removed, the first, second, and third exposing surfaces 221, 231, and 241 are formed, e.g., the first through third exposing surfaces 221 through 241 are lateral surfaces facing the interior of the first contact hole CNT1 and defining a sidewall of the first contact hole CNT1.

Figure 8E:
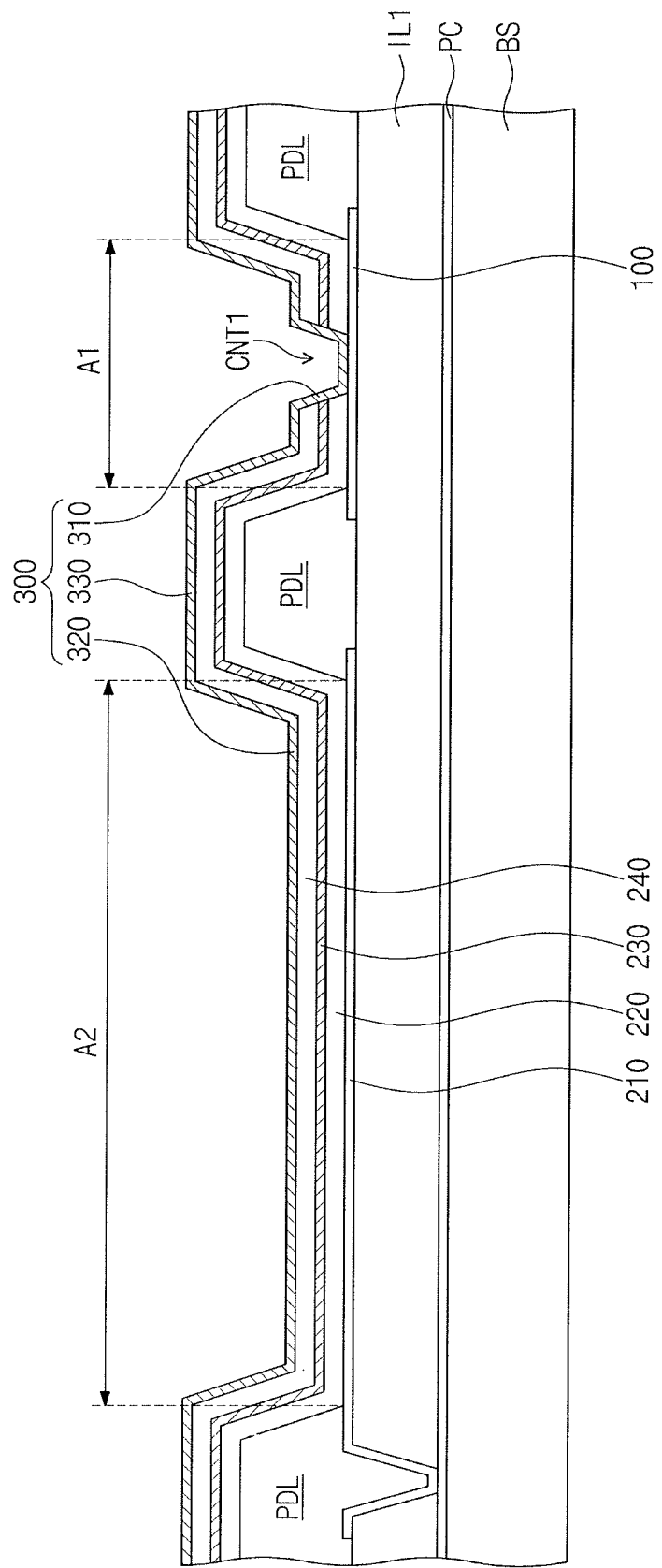
Figure 8F:
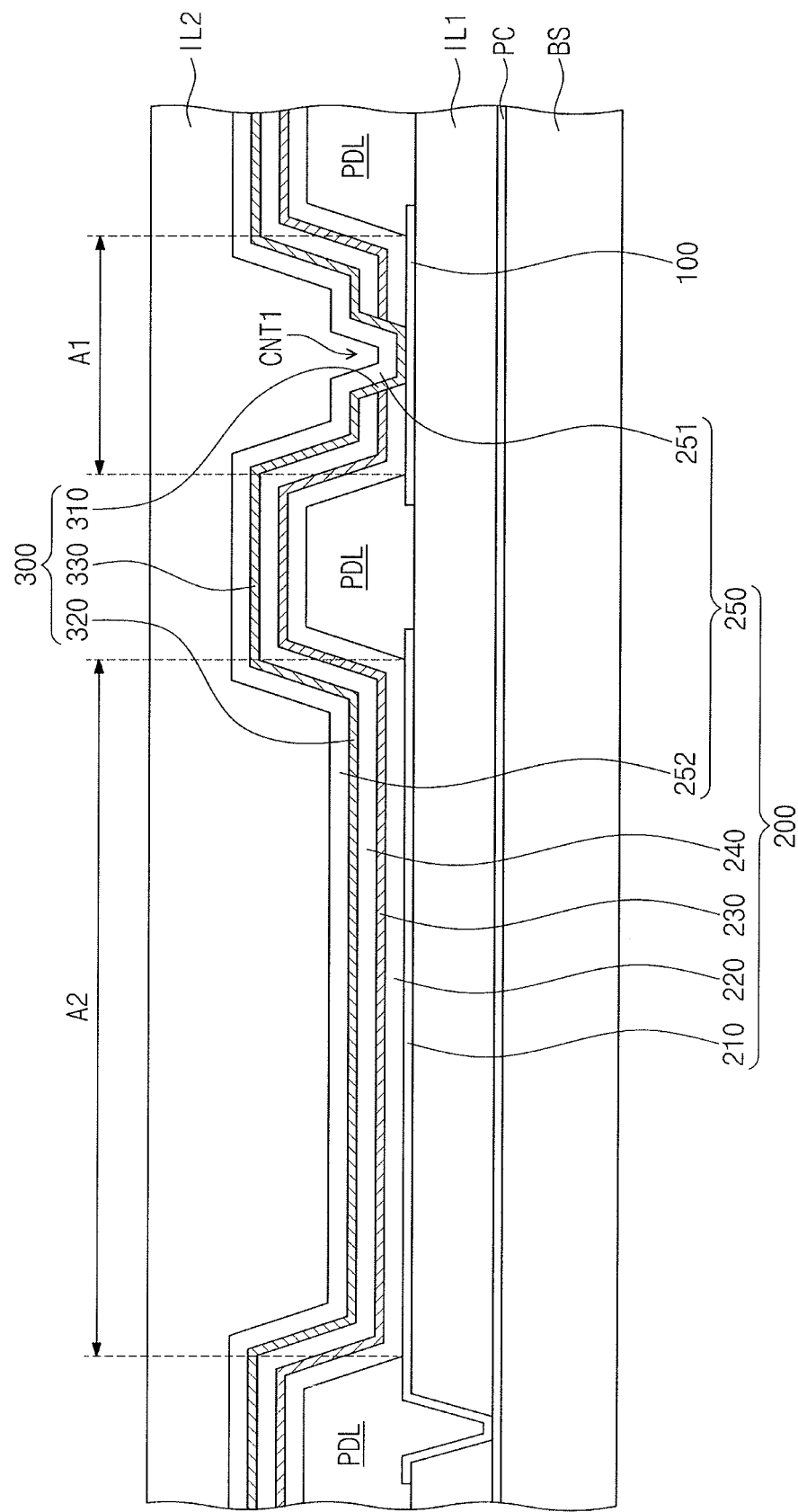

Referring to FIG. 8E, the insulating layer 300 is formed, e.g., conformally, on the second light emitting unit 240. The first part 310 is formed, e.g., conformally, in the first contact hole CNT1 and makes contact with the exposed auxiliary electrode 100. Then, as shown in FIG. 8F, the first electrode part 251 and the second insulating layer IL2 are formed on the insulating layer 300.

Figure 9A:
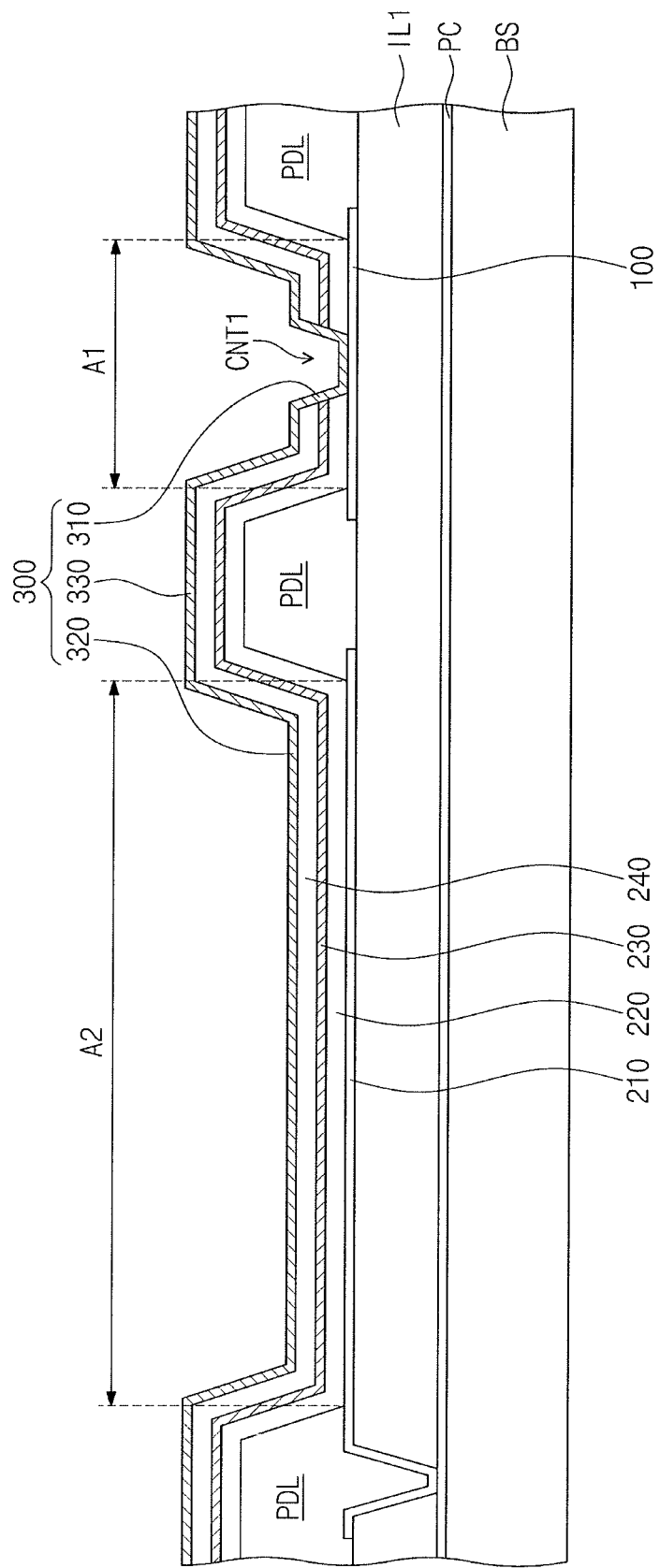
FIGS. 9A, 9B, and 9C illustrate cross-sectional views of stages in a method of manufacturing a display panel according to an exemplary embodiment.
Figure 9B:
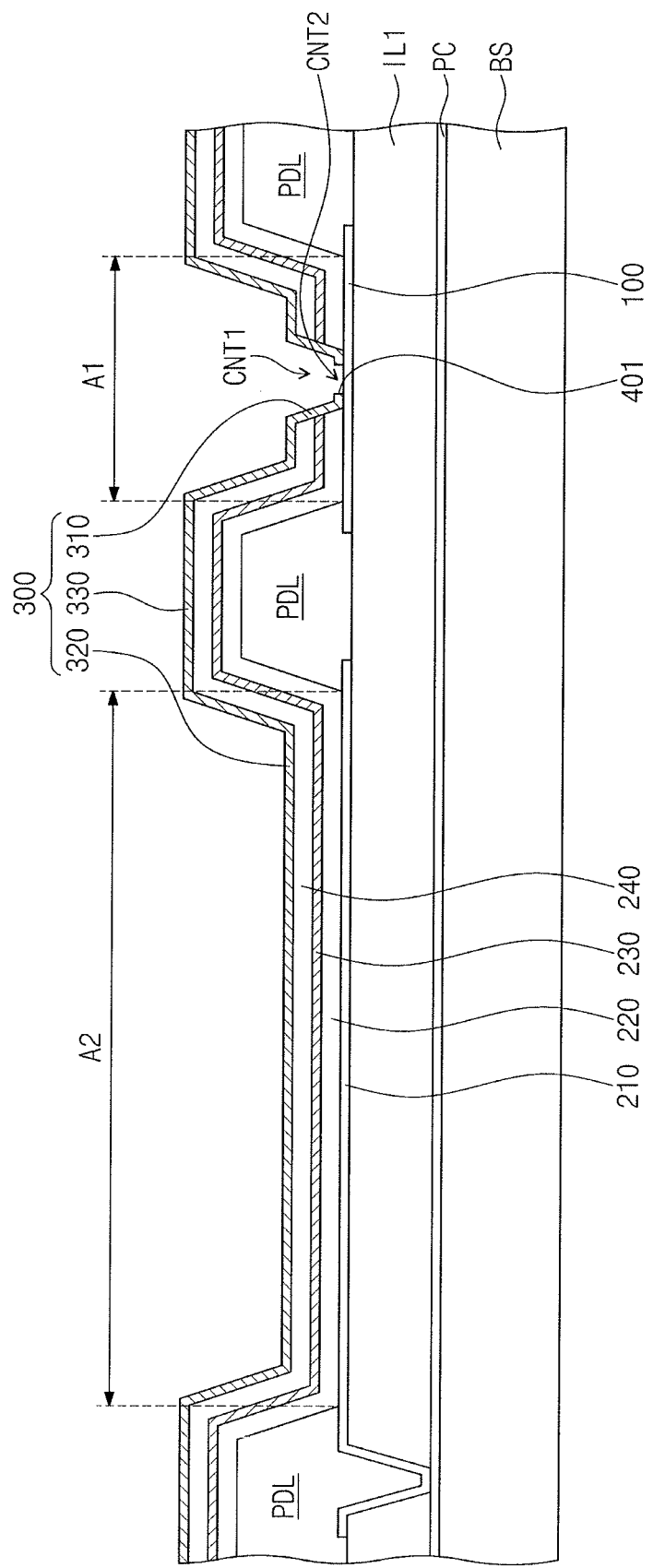
Figure 9C:
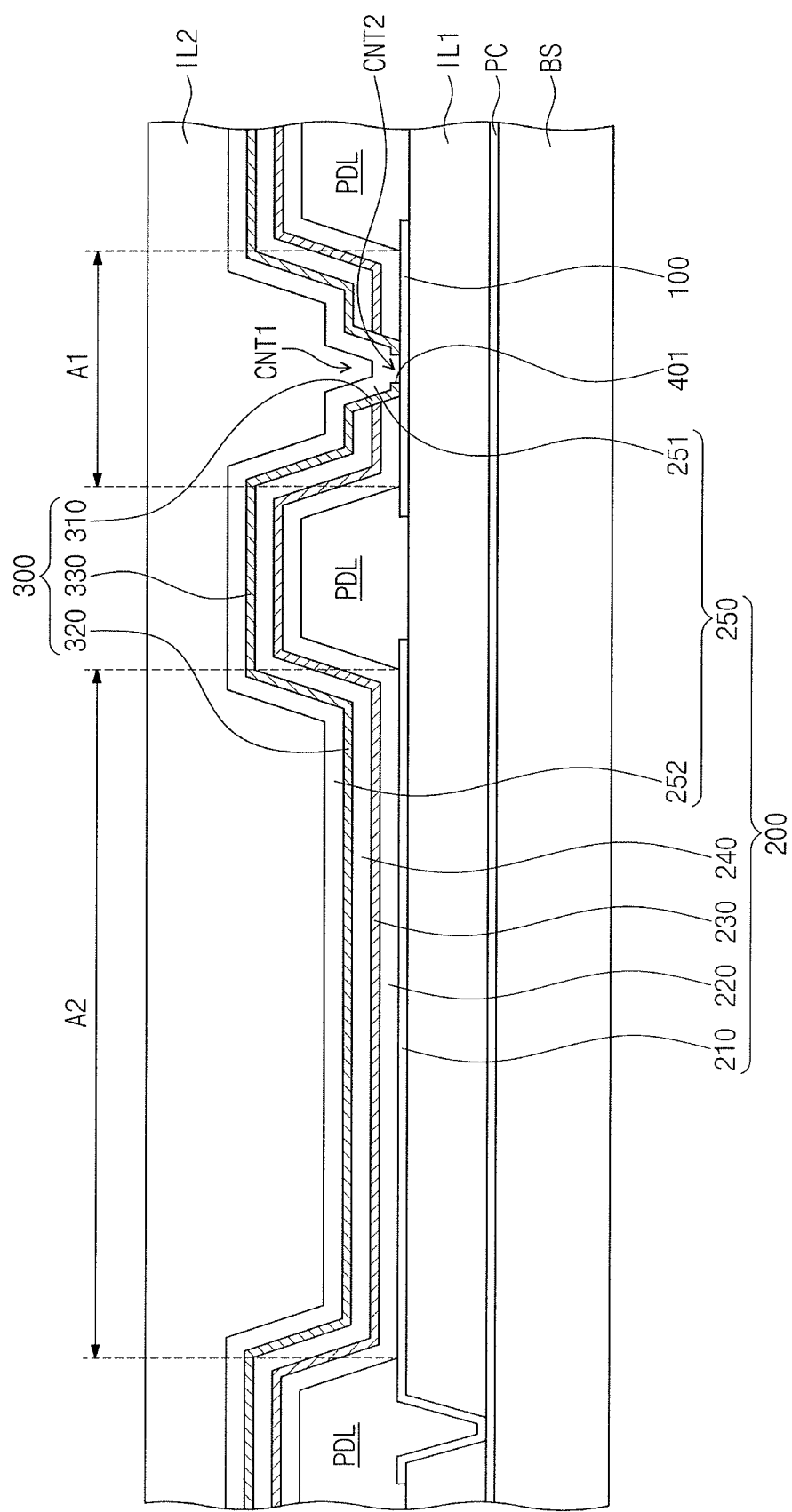

FIGS. 9A to 9C are cross-sectional views showing stages in a method of manufacturing a display panel according to an exemplary embodiment.

Referring to FIG. 9A, components including the pixel circuit layer PC, the insulating layer 300, and elements disposed between the pixel circuit layer PC and the insulating layer 300 are sequentially stacked on the base substrate BS. A method of stacking the pixel circuit layer PC, the insulating layer 300, and elements disposed between the pixel circuit layer PC and the insulating layer 300 are the same as the manufacturing method described with reference to FIGS. 8A to 8E, and thus details thereof will be omitted.

Referring to FIG. 9B, the second contact hole CNT2 is formed through the insulating layer 300. The second contact hole CNT2 is formed by removing a portion of the first part 310 in the first area A1 to expose a portion of the auxiliary electrode 100. As an example, the portion of the first part 310 may be removed by using a laser drilling method. When the portion of the first part 310 is removed, the fourth exposing surface 301 is formed.

As shown in FIG. 9C, the second electrode 250 is formed on the insulating layer 300. The first electrode part 251 makes contact with the auxiliary electrode 100 exposed through the second contact hole CNT2. The second insulating layer IL2 is formed on the second electrode 250.

By way of summation and review, the present disclosure provides a display panel capable of preventing poor emission of an organic light emitting element due to a lateral leakage current. The present disclosure also provides a method of manufacturing the display panel, as well as a display device having the display panel.

That is, according to embodiments, a insulating layer is disposed between the conductive thin film layer and the second electrode to insulate the conductive thin film layer from the second electrode. Accordingly, the lateral leakage current may be prevented from flowing through the conductive thin film layer, and defect in light emission of the organic light emitting element may be prevented from occurring due to the lateral leakage current.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel comprising:
a base substrate including:
a light emitting area and a non-light emitting area adjacent to the light emitting area;
a first electrode disposed in the light emitting area;
an auxiliary electrode disposed in the non-light emitting area;
a first light emitting unit disposed on the auxiliary electrode and the first electrode;
a conductive thin film layer disposed on the first light emitting unit;
a second light emitting unit disposed on the conductive thin film layer;
a second electrode disposed on the second light emitting unit; and
an insulating layer disposed between the first electrode and the second electrode,
wherein a part of the insulating layer contacts the auxiliary electrode.

2. The display panel of claim 1, wherein the insulating layer is disposed between the second light emitting unit and the second electrode.

3. The display panel of claim 1, wherein:
the display panel further includes a first contact hole that overlaps the non-light emitting area and exposes a part of the auxiliary electrode through the first light emitting unit, the conductive thin film layer, and the second light emitting unit; and
the part of the insulating layer is in contact with the auxiliary electrode through the first contact hole.

4. The display panel of claim 3, wherein a side surface of the conductive thin film layer defining the first contact hole is in contact with the insulating layer.

5. The display panel of claim 1, wherein the first light emitting unit is configured to generate first light, and the second light emitting unit is configured to generate light having a color different from a color of the first light.

6. The display panel of claim 1, wherein a resistance of the insulating layer is greater than a resistance of the conductive thin film layer.

7. The display panel of claim 1, wherein a thickness of the insulating layer is 10 nm or less.

8. The display panel of claim 1, wherein the insulating layer includes at least one of LiF and LiQ.

9. The display panel of claim 1, wherein:
the insulating layer includes a first contact hole overlapping and exposing a part of the auxiliary electrode penetrating the insulating layer; and
the second electrode is in contact with the auxiliary electrode through the first contact hole.

10. A display panel comprising:
a base substrate including:
a light emitting area and a non-light emitting area adjacent to the light emitting area;
a first electrode disposed in the light emitting area of the base substrate;
an auxiliary electrode disposed in the non-light emitting area of the base substrate;
a first light emitting unit disposed on the auxiliary electrode and the first electrode;
a conductive thin film layer disposed on the first light emitting unit;
a second light emitting unit disposed on the conductive thin film layer;
a second electrode disposed on the second light emitting unit; and
an insulating layer disposed on the second light emitting unit,
wherein a part of the insulating layer contacts the auxiliary electrode.

11. The display panel of claim 10, wherein:
the display panel further includes a contact hole that overlaps the non-light emitting area and exposes a part of the auxiliary electrode through the first light emitting unit and the conductive thin film layer; and the part of the insulating layer is in contact with the auxiliary electrode through the contact hole.

12. The display panel of claim 10, wherein a resistance of the insulating layer is greater than a resistance of the conductive thin film layer.

13. A display panel comprising:
a base substrate including:
    a light emitting area and a non-light emitting area adjacent to the light emitting area;
    a first electrode disposed in the light emitting area of the base substrate;
    an auxiliary electrode disposed in the non-light emitting area of the base substrate;
    a first light emitting unit disposed on the auxiliary electrode and the first electrode;
    a conductive thin film layer disposed on the first light emitting unit;
    a second light emitting unit disposed on the conductive thin film layer;
    a second electrode disposed on the second light emitting unit; and
    an insulating layer disposed on the second light emitting unit,
wherein the insulating layer is spaced apart from the light emitting area, and overlaps the non-light emitting area, and
wherein a part of the insulating layer contacts the auxiliary electrode.

14. The display panel of claim 13, wherein the insulating layer is disposed between the second light emitting unit and the second electrode.

15. The display panel of claim 13, wherein:
the display panel includes a contact hole that overlaps the non-light emitting area and exposes a part of the auxiliary electrode through the first light emitting unit, the conductive thin film layer, and the second light emitting unit; and
the part of the insulating layer is in contact with the auxiliary electrode through the contact hole.

16. A display panel comprising:
a plurality of pixels each including at least one transistor and an organic light emitting element connected to the transistor, the pixels being spaced apart from each other in a first direction and a second direction crossing each other, the organic light emitting element including a first electrode, a first light emitting unit disposed on the first electrode, a conductive thin film layer disposed on the first light emitting unit, a second light emitting unit disposed on the conductive thin film layer, and a second electrode disposed on the second light emitting unit;
an auxiliary electrode including a first extension part extending in the first direction and disposed between the pixels spaced apart along the second direction, and a second extension part extending in the second direction and disposed between the pixels spaced apart along the first direction; and
an insulating layer covering the auxiliary electrode,
wherein a part of the auxiliary electrode and the insulating layer are contacted by a contact hole exposing at least a part of the auxiliary electrode at an intersection point of the first extension part and the second extension part.

17. The display panel of claim 16, wherein the auxiliary electrode has a grid shape.

18. The display panel of claim 16, wherein
the first light emitting unit and the second light emitting unit are configured to generate different light.

19. The display panel of claim 18, wherein:
the insulating layer is disposed on the second light emitting unit; and
the contact hole overlaps the auxiliary electrode and is defined through the first light emitting unit, the conductive thin film layer, and the second light emitting unit.

20. The display panel of claim 18, wherein:
the insulating layer is disposed between the conductive thin film layer and second electrode; and
the contact hole overlaps the auxiliary electrode and is defined through the first light emitting unit, and the conductive thin film layer.

21. The display panel of claim 18, wherein:
the first electrode is spaced apart from the auxiliary electrode; and
at least one of the first light emitting unit, conductive thin film layer, the second light emitting unit, and the second electrode overlaps the auxiliary electrode.

* * * * *